(12) United States Patent
Lee et al.

(10) Patent No.: US 10,403,638 B2
(45) Date of Patent: Sep. 3, 2019

(54) VERTICAL MEMORY DEVICES AND METHODS OF MANUFACTURING THE SAME

(71) Applicant: SAMSUNG ELECTRONICS CO., LTD., Suwon-si, Gyeonggi-do (KR)

(72) Inventors: Joon-Suk Lee, Seoul (KR); Hong-Suk Kim, Yongin-si (KR); Jae-Young Ahn, Seongnam-si (KR); Han-Jin Lim, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 5 days.

(21) Appl. No.: 15/610,923

(22) Filed: Jun. 1, 2017

(65) Prior Publication Data
US 2018/0122822 A1 May 3, 2018

(30) Foreign Application Priority Data
Nov. 1, 2016 (KR) .................... 10-2016-0144173

(51) Int. Cl.
| | |
|---|---|
| *H01L 29/10* | (2006.01) |
| *H01L 29/66* | (2006.01) |
| *H01L 29/78* | (2006.01) |
| *H01L 27/1157* | (2017.01) |
| *H01L 27/11582* | (2017.01) |

(52) U.S. Cl.
CPC .... *H01L 27/11582* (2013.01); *H01L 27/1157* (2013.01); *H01L 29/1045* (2013.01); *H01L 29/66666* (2013.01); *H01L 29/7827* (2013.01)

(58) Field of Classification Search
None
See application file for complete search history.

(56) References Cited

U.S. PATENT DOCUMENTS

| | | |
|---|---|---|
| 7,956,408 B2 | 6/2011 | Enda et al. |
| 7,977,733 B2 | 7/2011 | Shiino et al. |
| 8,877,624 B2 | 11/2014 | Hull et al. |
| 8,987,087 B2 | 3/2015 | Chien et al. |
| 9,064,736 B2 | 6/2015 | Lee et al. |
| 9,324,727 B2 | 4/2016 | Lee et al. |

(Continued)

FOREIGN PATENT DOCUMENTS

KR  10-2015-0138511 A  12/2015

*Primary Examiner* — Jay C Chang
(74) *Attorney, Agent, or Firm* — Lee & Morse, P.C.

(57) ABSTRACT

A vertical memory device includes a first structure having a lower semiconductor pattern structure filling a recess on a substrate and protruding from an upper surface of the substrate in a first direction substantially perpendicular to the upper surface of the substrate, the lower semiconductor pattern structure including a first undoped semiconductor pattern, a doped semiconductor pattern, and a second undoped semiconductor pattern sequentially stacked, and a lower surface of the doped semiconductor pattern being lower than the upper surface of the substrate, and an upper semiconductor pattern extending in the first direction on the lower semiconductor pattern structure, and a plurality of gate electrodes surrounding a sidewall of the first structure, the plurality of gate electrodes being at a plurality of levels, respectively, so as to be spaced apart from each other in the first direction.

17 Claims, 18 Drawing Sheets

(56) References Cited

U.S. PATENT DOCUMENTS

| | | |
|---|---|---|
| 9,379,134 B2 | 6/2016 | Lee et al. |
| 2014/0353667 A1* | 12/2014 | Konrath ................ H01L 29/267 257/66 |
| 2015/0104916 A1* | 4/2015 | Lee ..................... H01L 27/1157 438/268 |
| 2015/0372056 A1* | 12/2015 | Seong ................ H01L 27/2409 257/4 |
| 2016/0056169 A1 | 2/2016 | Lee et al. |
| 2016/0126316 A1* | 5/2016 | Wu ...................... H01L 29/165 257/190 |

\* cited by examiner

VERTICAL MEMORY DEVICES AND METHODS OF MANUFACTURING THE SAME

CROSS-REFERENCE TO RELATED APPLICATION

Korean Patent Application No. 10-2016-0144173, filed on Nov. 1, 2016, in the Korean Intellectual Property Office, and entitled: "Vertical Memory Devices and Methods of Manufacturing the Same," is incorporated by reference herein in its entirety.

BACKGROUND

1. Field

Embodiments relate to vertical memory devices and methods of manufacturing the same, and more particularly, to vertical non-volatile memory devices including vertical channels and methods of manufacturing the same.

2. Description of the Related Art

When a VNAND flash memory device is fabricated, a plurality of channel holes may be formed, semiconductor patterns may be formed in lower portions of the channel holes by a SEG process, and impurities may be implanted into the semiconductor patterns by an ion implantation process.

SUMMARY

According to an aspect of embodiments, there is provided a vertical memory device. The vertical memory device may include a first structure and a plurality of gate electrodes. The first structure may include a lower semiconductor pattern structure and an upper semiconductor pattern. The lower semiconductor pattern structure may fill a recess on a substrate and protrude from an upper surface of the substrate in a first direction substantially perpendicular to the upper surface of the substrate. The lower semiconductor pattern structure may include a first undoped semiconductor pattern, a doped semiconductor pattern, and a second undoped semiconductor pattern sequentially stacked, and a lower surface of the doped semiconductor pattern may be lower than the upper surface of the substrate. The upper semiconductor pattern may extend in the first direction on the lower semiconductor pattern structure. The plurality of gate electrodes may surround a sidewall of the first structure, and may be spaced apart from each other in the first direction at a plurality of levels, respectively.

According to another aspect of embodiments, there is provided a vertical memory device. The vertical memory device may include a first structure and a plurality of gate electrodes. The first structure may include a lower semiconductor pattern structure and an upper semiconductor pattern. The lower semiconductor pattern structure may fill a recess on a substrate and protrude from an upper surface of the substrate in a first direction substantially perpendicular to the upper surface of the substrate. The lower semiconductor pattern structure may include a first undoped semiconductor pattern, a doped semiconductor pattern, a diffusion prevention pattern, and a second undoped semiconductor pattern sequentially stacked. The doped semiconductor pattern may include a silicon pattern doped with p-type impurities, and the diffusion prevention pattern may include a silicon pattern doped with carbon and the p-type impurities. The upper semiconductor pattern may extend in the first direction on the lower semiconductor pattern structure. The plurality of gate electrodes may surround a sidewall of the first structure, and may be spaced apart from each other in the first direction at a plurality of levels, respectively.

According to yet another aspect of embodiments, there is provided a vertical memory device. The vertical memory device may include a channel structure and a gate electrode. The channel structure may include a lower channel structure and an upper channel structure sequentially stacked on an upper surface of a substrate in a first direction substantially perpendicular to the upper surface of the substrate. The gate electrode structure may include a plurality of gate electrodes spaced apart from each other in the first direction, and each of the plurality of gate electrodes may extend in a second direction substantially parallel to the upper surface of the substrate and surrounding a sidewall of the channel structure. The gate electrode structure may include at least one first gate electrode, a plurality of second gate electrodes, and at least one third gate electrode sequentially stacked on the upper surface of the substrate in the first direction. The lower channel structure may include a doped semiconductor pattern, and first and second diffusion prevention patterns. The doped semiconductor pattern may be adjacent the first gate electrode, and the first and second diffusion prevention patterns may cover lower and upper surfaces of the doped semiconductor pattern, respectively.

According to still another aspect of embodiments, there is provided a method of manufacturing a vertical memory device. In the method, a channel hole may be formed through insulation layers and sacrificial layers that are alternately and repeatedly stacked on a substrate. A lower semiconductor pattern structure may be formed to fill a lower portion of the channel hole. The lower semiconductor pattern structure may include a first undoped semiconductor pattern, a doped semiconductor pattern, and a second undoped semiconductor pattern sequentially stacked. An upper semiconductor pattern may be formed on the lower semiconductor pattern structure to partially fill an upper portion of the channel hole. The sacrificial layers may be removed to form gaps. Gate electrodes may be formed to fill the gaps.

According to yet another aspect of embodiments, there is provided a method of manufacturing a vertical memory device. In the method, a channel hole may be formed through insulation layers and sacrificial layers that are alternately and repeatedly stacked on a substrate. A first SEG process, a second SEG process, and a third SEG process may be sequentially performed to form a lower channel structure at a lower portion of the channel hole. The first SEG process may be performed using a semiconductor source gas, the second SEG process may be performed using a semiconductor source gas and an impurity source gas, and the third SEG process may be performed using a semiconductor source gas. An upper channel structure may be formed on the lower channel structure to partially fill an upper portion of the channel hole. The sacrificial layers may be removed to form gaps. Gate electrodes may be formed to fill the gaps.

According to still another aspect of embodiments, there is provided a vertical memory device. The vertical memory device may include a lower semiconductor pattern structure filling a recess on a substrate and protruding above the substrate, the lower semiconductor pattern structure including a first undoped semiconductor pattern, a doped semiconductor pattern, and a second undoped semiconductor pattern sequentially stacked, only the doped semiconductor pattern including impurities among the first undoped semiconductor pattern, the doped semiconductor pattern, and he second undoped semiconductor pattern, an upper semiconductor pattern on the lower semiconductor pattern structure, and a plurality of gate electrodes surrounding a sidewall of the first structure, the plurality of gate electrodes being at a plurality of levels, respectively, so as to be spaced apart from each other in the first direction.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, a direction substantially perpendicular to an upper surface of a substrate will be referred to as a first direction, and directions substantially parallel to the upper surface of the substrate and crossing each other will be referred to as second and third directions, respectively. In example embodiments, the second and third directions may be substantially perpendicular to each other.

Figure 1:
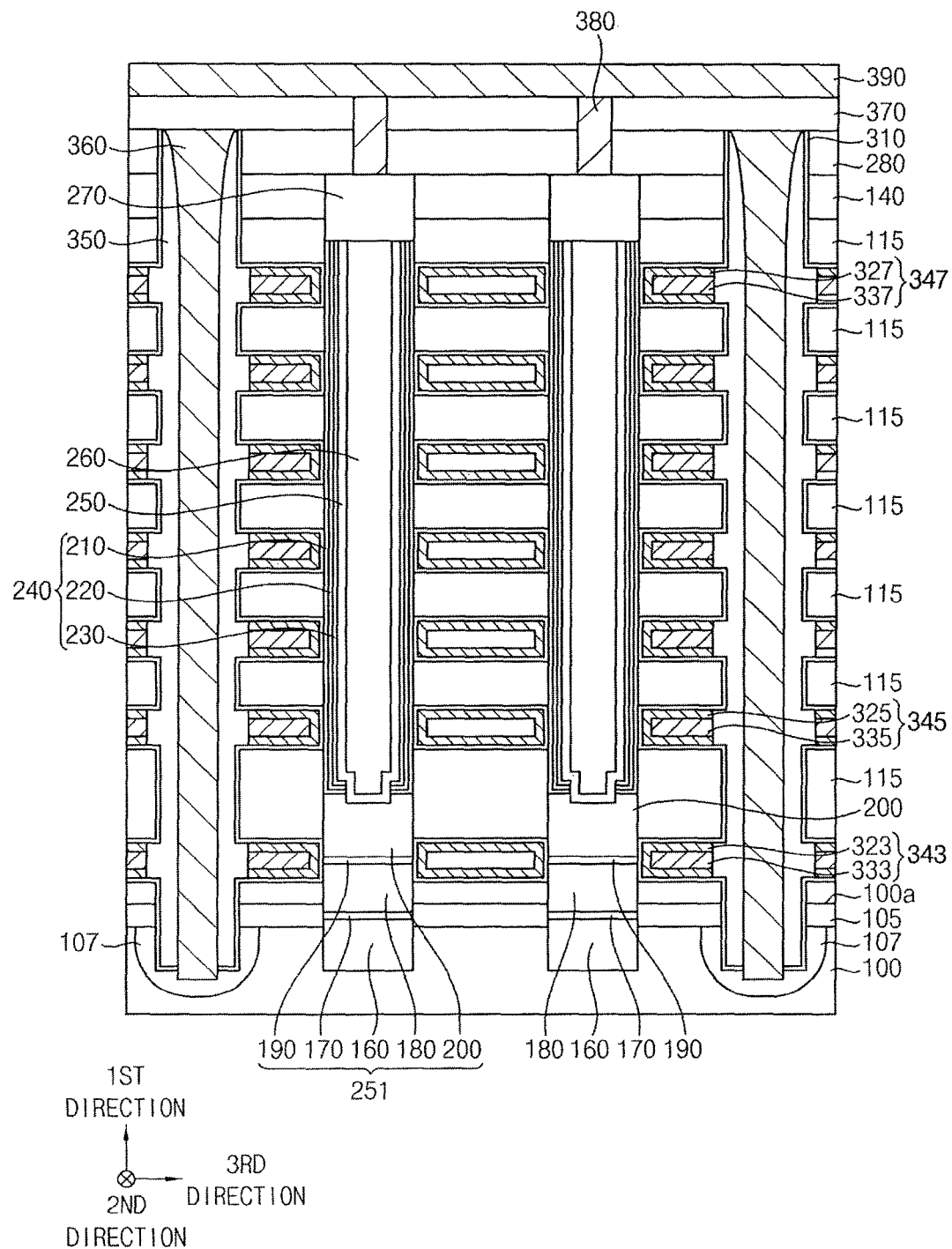
FIG. 1 illustrates a cross-sectional view of a vertical memory device in accordance with example embodiments.

FIG. 1 is a cross-sectional view illustrating a vertical memory device in accordance with example embodiments.

Referring to FIG. 1, the vertical memory device may include memory cells on a substrate 100, and each memory cell may include a channel structure, a charge storage structure 240, and first to third gate electrodes 343, 345, and 347.

The substrate 100 may include silicon, germanium, silicon-germanium or a III-V compound, e.g., GaP, GaAs, GaSb, etc. In some embodiments, the substrate 100 may be a silicon-on-insulator (SOI) substrate or a germanium-on-insulator (GOI) substrate. A first impurity region 105 doped with p-type impurities, e.g., boron, aluminum, etc., may be formed at an upper portion of the substrate 100, e.g., the first impurity region 105 may be formed in the upper portion of the substrate 100 below an upper surface 100a of the substrate 100.

The memory cells may be arranged in the second and third directions to form a memory cell array. Particularly, the memory cell array may include a plurality of memory cell blocks arranged in the third direction, and the plurality of memory cell blocks may be divided by a common source/drain line (CSL) 360 extending in the second direction. Each memory cell block may serve as a basic unit for programming and erasing in the vertical memory device. Each memory cell block may include a plurality of memory cells arranged in the second direction.

Each memory cell block may include a channel structure block therein. Each channel structure block may include a plurality of channel structure columns arranged in the third direction, and each channel structure column may include a plurality of channel structures arranged in the second direction.

The channel structure may include a lower channel structure 251 and an upper channel structure 250. The lower channel structure 251 and the upper channel structure 250 may include a semiconductor material, and thus may be referred to as a lower semiconductor pattern structure 251 and an upper semiconductor pattern structure 250, respectively.

The lower semiconductor pattern structure 251 may include a first undoped semiconductor pattern 160, a first diffusion prevention pattern 170, a doped semiconductor pattern 180, a second diffusion prevention pattern 190, and a second undoped semiconductor pattern 200, and may have a pillar shape on the substrate 100. The upper semiconductor pattern structure 250 may be above the second undoped semiconductor pattern 200 of the semiconductor pattern structure 251.

Each of the first and second undoped semiconductor patterns 160 and 200 may include a single crystalline semiconductor material, e.g., single crystalline silicon, single crystalline germanium, etc. The doped semiconductor pattern 180 may include a single crystalline semiconductor material doped with p-type impurities, e.g., boron. The first diffusion prevention pattern 170 may include a single crystalline semiconductor material doped with carbon. The second diffusion prevention pattern 190 may include a single crystalline material doped with p-type impurities, e.g., boron. In example embodiments, the first diffusion prevention pattern 170 may include a semiconductor material substantially the same as that of the first undoped semiconductor pattern 160, and the second diffusion prevention pattern 190 may include a semiconductor material substantially the same as that of the doped semiconductor pattern 180.

The first undoped semiconductor pattern 160 may partially fill a recess on the substrate 100. For example, an upper surface of the first undoped semiconductor pattern 160 may be lower than the upper surface 100a of the substrate 100 on which no recess is formed, e.g., the upper surface of the first undoped semiconductor pattern 160 may be lower than a lower surface of the first impurity region 105. However, embodiments are not limited thereto. The first diffusion prevention pattern 170 may partially fill the recess, and an upper surface of the first diffusion prevention pattern 170 may be lower than the upper surface 100a of the substrate 100 on which no recess is formed.

The doped semiconductor pattern 180 may be formed on the first diffusion prevention pattern 170, and a lower surface of the doped semiconductor pattern 180 may be lower than the upper surface of the substrate 100 on which no recess is formed. Thus, the doped semiconductor pattern 180 may overlap at least a portion of the first gate electrode 343 in a horizontal direction substantially parallel to the upper surface of the substrate 100. In an example embodiment, an upper surface of the doped semiconductor pattern 180 may be lower than an upper surface of the first gate electrode 343, however, embodiments are not limited thereto.

The doped semiconductor pattern 180 may serve as a channel of a transistor including the first gate electrode 343. The doped semiconductor pattern 180 may overlap at least a portion of the first gate electrode 343 in a horizontal direction, and thus may contact the first impurity region 105 at the upper portion of the substrate 100. The doped semiconductor pattern 180 together with the first impurity region 105 may serve as a channel of the transistor.

An upper surface of the second diffusion prevention pattern 190 may be lower than an upper surface of the first gate electrode 343, however, embodiments are not limited thereto. The first and second diffusion prevention patterns 170 and 190 may prevent or reduce doped impurities in the doped semiconductor pattern 180 from diffusing into the first and second undoped semiconductor patterns 160 and 200, respectively.

An upper surface of the second undoped semiconductor pattern 200 may be located between lower and upper surfaces of one of the insulation patterns 115 at a second level from the upper surface of the substrate 100. For example, as illustrated in FIG. 1, the upper surface of the second undoped semiconductor pattern 200 may be at a height level between lower and upper surfaces of a second insulation pattern 115, which is the insulation pattern 115 between the first and second gate electrodes 343 and 345.

Not the whole portions but only a portion of each of the lower semiconductor pattern structures, e.g., only the doped semiconductor pattern 180, may be doped with impurities. Thus, the impurity concentration distribution may be small among the lower semiconductor pattern structures. That is, the doped semiconductor pattern 180 may have a minimum thickness in the first direction under conditions in that the doped semiconductor pattern 180 overlaps a portion of the first gate electrode 343 and a portion of the first impurity region 105 in a horizontal direction to serve as a channel of a transistor, and thus the impurity concentration distribution of the plurality of lower semiconductor pattern structures may decrease. Accordingly, the characteristic distribution among transistors using the lower semiconductor pattern structures as channels may be enhanced.

The upper semiconductor pattern 250 may contact an upper central surface of the lower semiconductor pattern structure 251, and may extend in the first direction. In example embodiments, the upper semiconductor pattern 250 may have a cup-like shape, and a filling pattern 260 may be formed in an inner space defined by the cup-like shape. The upper semiconductor pattern 250 may include doped or undoped polysilicon or single crystalline silicon, and the filling pattern 260 may include an oxide, e.g., silicon oxide.

The charge storage structure 240 may contact an upper edge surface of the lower semiconductor pattern structure, and may extend in the first direction. The charge storage structure 240 may cover an outer sidewall of the upper semiconductor pattern 250, and may have a cup-like shape of which a bottom is opened. The charge storage structure 240 may include a first blocking pattern 210, a chare storage pattern 220, and a tunnel insulation pattern 230 sequentially stacked.

A capping pattern 270 may be formed on a first structure including the channel structure, the filling pattern 260, and the charge storage structure 240. The capping pattern 270 may include doped or undoped polysilicon or single crystalline silicon.

In example embodiments, the first to third gate electrodes 343, 345, and 347 may be spaced apart from each other in the first direction by the insulation pattern 115, and each of the first to third gate electrodes 343, 345, and 347 may extend in the second direction. The insulation pattern 115 may include silicon oxide, e.g., PE-TEOS, HDP oxide, or PEOX.

The first gate electrode 343 may serve as a ground selection line (GSL), the second gate electrode 345 may serve as a word line, and the third gate electrode 347 may serve as a string selection line (SSL). Each of the first to third gate electrodes 343, 345, and 347 may be formed at a single level or a plurality of levels, and one or a plurality of dummy word lines may be formed between the first and second gate electrodes 343 and 345, and/or between the second and third gate electrodes 345 and 347.

In example embodiments, the first gate electrode 343 may be formed at a lowermost level, the third gate electrode 347 may be formed at an uppermost level and a level under the uppermost level, and the second gate electrode 345 may be formed at a plurality of levels between the first and third gate electrodes 343 and 347. Thus, the first gate electrode 343 may be formed adjacent to, e.g., and horizontally overlapping, the lower semiconductor pattern structure 251, e.g., adjacent to the doped semiconductor pattern 180, and each of the second and third gate electrodes 345 and 347 may be formed adjacent to, e.g., and horizontally overlapping, the upper semiconductor pattern 250.

The first gate electrode 343 may include a first gate conductive pattern 333 and a first gate barrier pattern 323 covering lower and upper surfaces and a portion of a sidewall of the first gate conductive pattern 333. The second gate electrode 345 may include a second gate conductive pattern 335 and a second gate barrier pattern 325 covering lower and upper surfaces and a portion of a sidewall of the second gate conductive pattern 335. The third gate electrode 347 may include a third gate conductive pattern 337 and a third gate barrier pattern 327 covering lower and upper surfaces and a portion of a sidewall of the third gate conductive pattern 337.

The first to third gate conductive patterns 333, 335, and 337 may include a low resistance metal, e.g., tungsten, titanium, tantalum, platinum, etc., and the first to third gate barrier patterns 323, 325 and 327 may include a metal nitride, e.g., titanium nitride, tantalum nitride, etc. Alternatively, each of the first to third gate barrier patterns 323, 325, and 327 may have a first layer including a metal and a second layer including a metal nitride.

Upper and lower surfaces and a sidewall adjacent the upper semiconductor pattern 250 of each of the first to third gate electrodes 343, 345, and 347 may be covered by a second blocking layer 310. The second blocking layer 310 may include a metal oxide, e.g., aluminum oxide, hafnium oxide, etc.

The CSL 360 may contact an upper surface of a second impurity region 107 at an upper portion of the substrate 100, and a sidewall of the CSL 360 may be covered by a second spacer 350. The second spacer 350 may include an oxide, e.g., silicon oxide.

A second insulating interlayer 140 may be formed on an uppermost insulation pattern 115, and the capping pattern 270 may extend through the second insulating interlayer 140. A third insulating interlayer 280 may be formed on the second insulating interlayer 140 and the capping pattern 270, and the CSL 360 and the second spacer 350 may extend through the second and third insulating interlayers 140 and 280, the first to third gate electrodes 343, 345 and 347, and the insulation patterns 115. A fourth insulating interlayer 370 may be formed on the third insulating interlayer 280, the CSL 360, the second spacer 350, and the second blocking layer 310, and a contact plug 380 may extend through the third and fourth insulating interlayers 280 and 370, and may contact an upper surface of the capping pattern 270. A fifth insulating interlayer may be formed on the fourth insulating interlayer 370 and the contact plug 380, and a bit line 390 may extend through the fifth insulating interlayer. The second to fourth insulating interlayers 140, 280, and 370 and the fifth insulating interlayer may include an oxide, e.g., silicon oxide, and the contact plug 380 and the bit line 390 may include a metal, e.g., copper, aluminum, etc., and/or a metal nitride, e.g., titanium nitride, tantalum nitride, tungsten nitride, etc.

The bit line 390 may contact an upper surface of the contact plug 380. In example embodiments, the bit line 390 may extend in the third direction, and a plurality of bit lines 390 may be formed in the second direction.

In the vertical memory device in accordance with example embodiments, impurities may be doped into only a portion of the lower semiconductor pattern structure 251 serving as a channel of the transistor including the GSL, i.e., the ground select transistor (GST). Thus, the impurity concentration distribution may decrease among the plurality of lower semiconductor pattern structures. Accordingly, the characteristic distribution among the GSTs may be enhanced.

FIGS. 2 to 13 are cross-sectional views illustrating stages of a method of manufacturing a vertical memory device in accordance with example embodiments.

Figure 2:
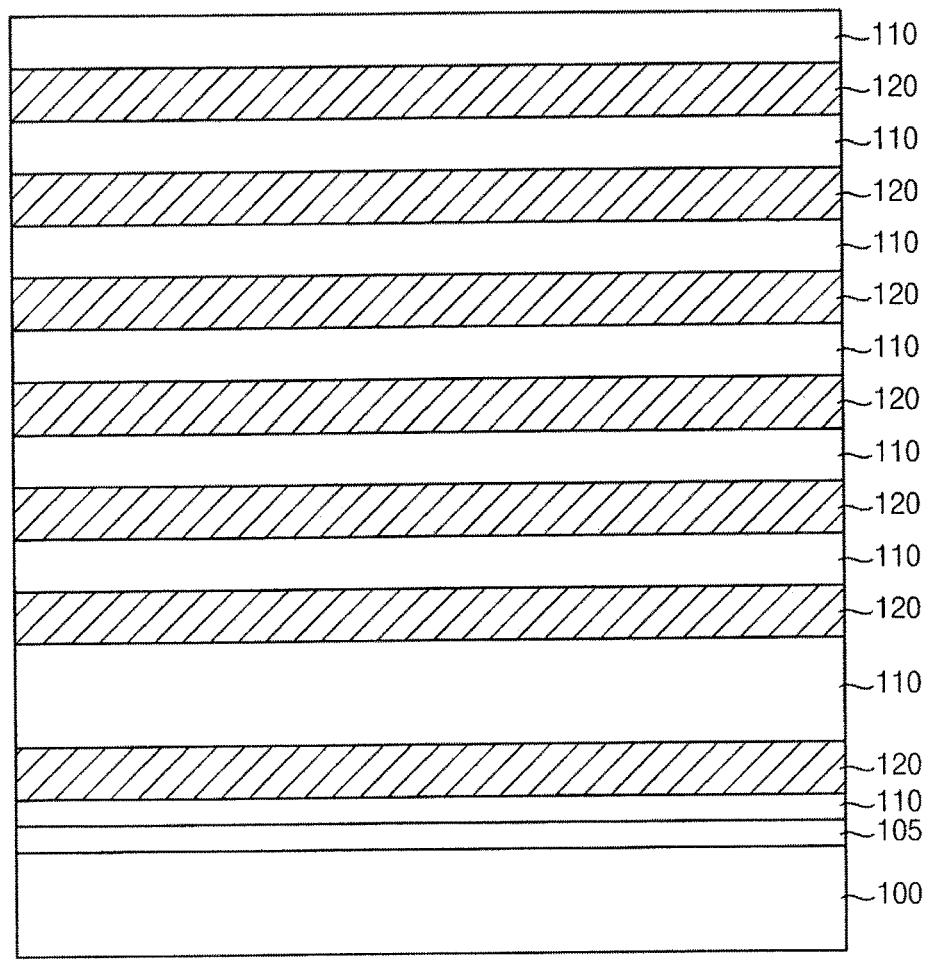
FIGS. 2 to 13 illustrate cross-sectional views of stages in a method of manufacturing a vertical memory device in accordance with example embodiments.
Figure 2:
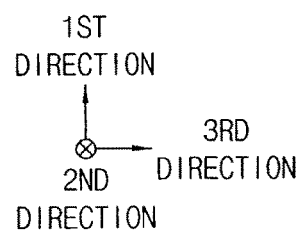

Referring to FIG. 2, impurities may be implanted into an upper portion of the substrate 100 to form the first impurity region 105, and insulation layers 110 and sacrificial layers 120 may be alternately and repeatedly formed on the substrate 100. Thus, having the first impurity region 105, a plurality of insulation layers 110 and a plurality of sacrificial layers 120 may be alternately stacked on each other in the first direction on the substrate 100. FIG. 2 shows, only for purposes of illustration, seven sacrificial layers 120 and eight insulation layers 110 alternately stacked. However, embodiments are not limited to any particular number of the sacrificial layers 120 or the insulation layers 110.

The first impurity region 105 may be formed by an ion implantation process. In example embodiments, the ion implantation process may be performed using p-type impurities, e.g., boron, aluminum, etc., and thus, the first impurity region 105 may include p-type impurities.

The insulation layers 110 and the sacrificial layers 120 may be formed by a chemical vapor deposition (CVD) process, a plasma enhanced chemical vapor deposition (PE-CVD) process, an atomic layer deposition (ALD) process, etc. For example, a lowermost one of the insulation layers 110 may be formed by a thermal oxidation process of an upper surface of the substrate 100.

The insulation layer 110 may be formed of a silicon oxide, e.g., plasma enhanced tetraethylorthosilicate (PE-TEOS), high density plasma (HDP) oxide, plasma enhanced oxide (PEOX), etc. The sacrificial layers 120 may be formed of a material having an etching selectivity with respect to the insulation layers 110, e.g., silicon nitride.

A trimming process may be repeatedly performed to form a staircase structure including a plurality of steps consisting of the sacrificial layers 120 and the insulation layers 110 sequentially stacked. In example embodiments, the trimming process may be performed as follows. A photoresist pattern may be formed on an uppermost one of the insulation layers 110 to partially cover the uppermost one of the insulation layers 110, and the uppermost one of the insulation layers 110 and an uppermost one of the sacrificial layers 120 may be etched using the photoresist pattern as an etching mask. Thus, a portion of one of the insulation layers 110 under the uppermost one of the sacrificial layers 120 may be exposed. After reducing an area of the photoresist pattern, the uppermost one of the insulation layers 110, the uppermost one of the sacrificial layers 120, the exposed one of the insulation layers 110, and one of the sacrificial layers 120 under the exposed one of the insulation layers 110 may be etched using the reduced photoresist pattern as an etching mask. The above process may be repeatedly performed to form the staircase structure. In example embodiments, the steps included in the staircase structure may have areas decreasing by a constant ratio from a bottom toward a top thereof.

Figure 3:
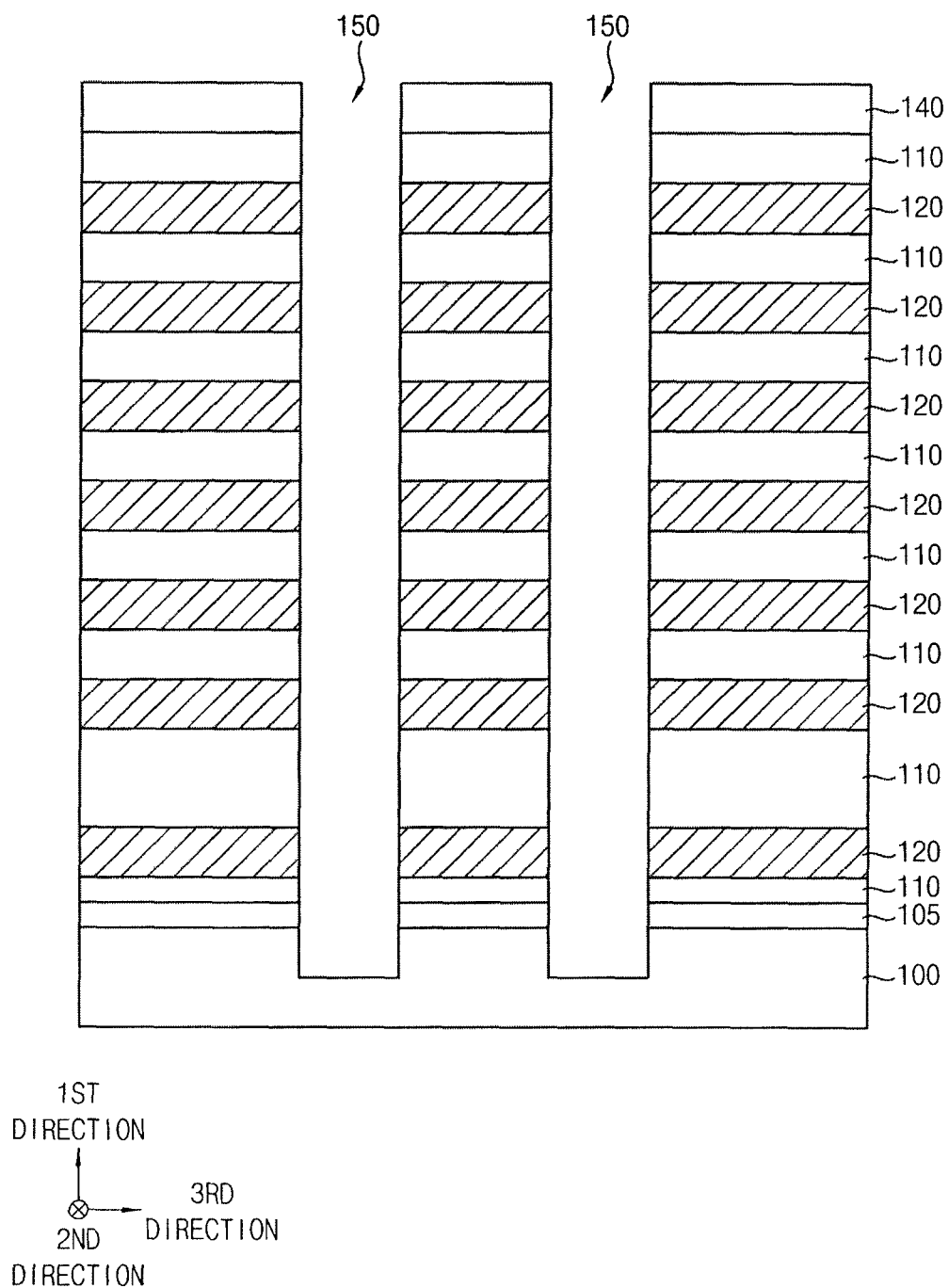

Referring to FIG. 3, a first insulating interlayer may be formed on the substrate 100 to cover the staircase structure, and may be planarized until an upper surface of the uppermost one of the insulating interlayers 110 is exposed to form a first insulating interlayer pattern covering sidewalls of the staircase structure. The first insulating interlayer may be formed of an oxide, e.g., silicon oxide, and thus the first insulating interlayer pattern may be merged with the insulation layer 110. The planarization process may be performed by a chemical mechanical polishing (CMP) process and/or an etch back process.

The second insulating interlayer 140 may be formed on an upper surface of the staircase structure and an upper surface of the first insulating interlayer pattern. The second insulating interlayer 140 may be formed of an oxide, e.g., silicon oxide, and thus may be merged with the first insulating interlayer pattern and/or the uppermost one of the insulation layers 110.

A first mask may be formed on the second insulating interlayer 140. The second insulating interlayer 140, the insulation layers 110, and the sacrificial layers 120 may be etched using the first mask as an etching mask to form a channel hole 150 therethrough exposing an upper surface of the substrate 100.

In example embodiments, a plurality of channel holes 150 may be formed, e.g., to be spaced apart from each other, in the second and third directions to form a channel array. In example embodiments, the channel hole array may include a first channel hole column including a plurality of first channel holes arranged in the second direction, and a second channel hole column being spaced apart from the first channel hole column in the third direction and including a plurality of second holes arranged in the second direction. The first and second channel hole columns may be alternately and repeatedly formed in the third direction to form a channel hole block.

In example embodiments, when the channel hole 150 is formed, an upper portion of the substrate 100 may be partially removed to form a recess in the substrate 100. The channel hole 150 may include the recess in the substrate 100, e.g., the recess may define the bottom of the channel hole 150. The recess may have a depth greater than a lower surface of the first impurity region 105, e.g., the recess may extend through the first impurity region 105 to have a bottom lower than the lower surface of the first impurity region 105 relative to the bottom of the substrate 100.

Figure 4:
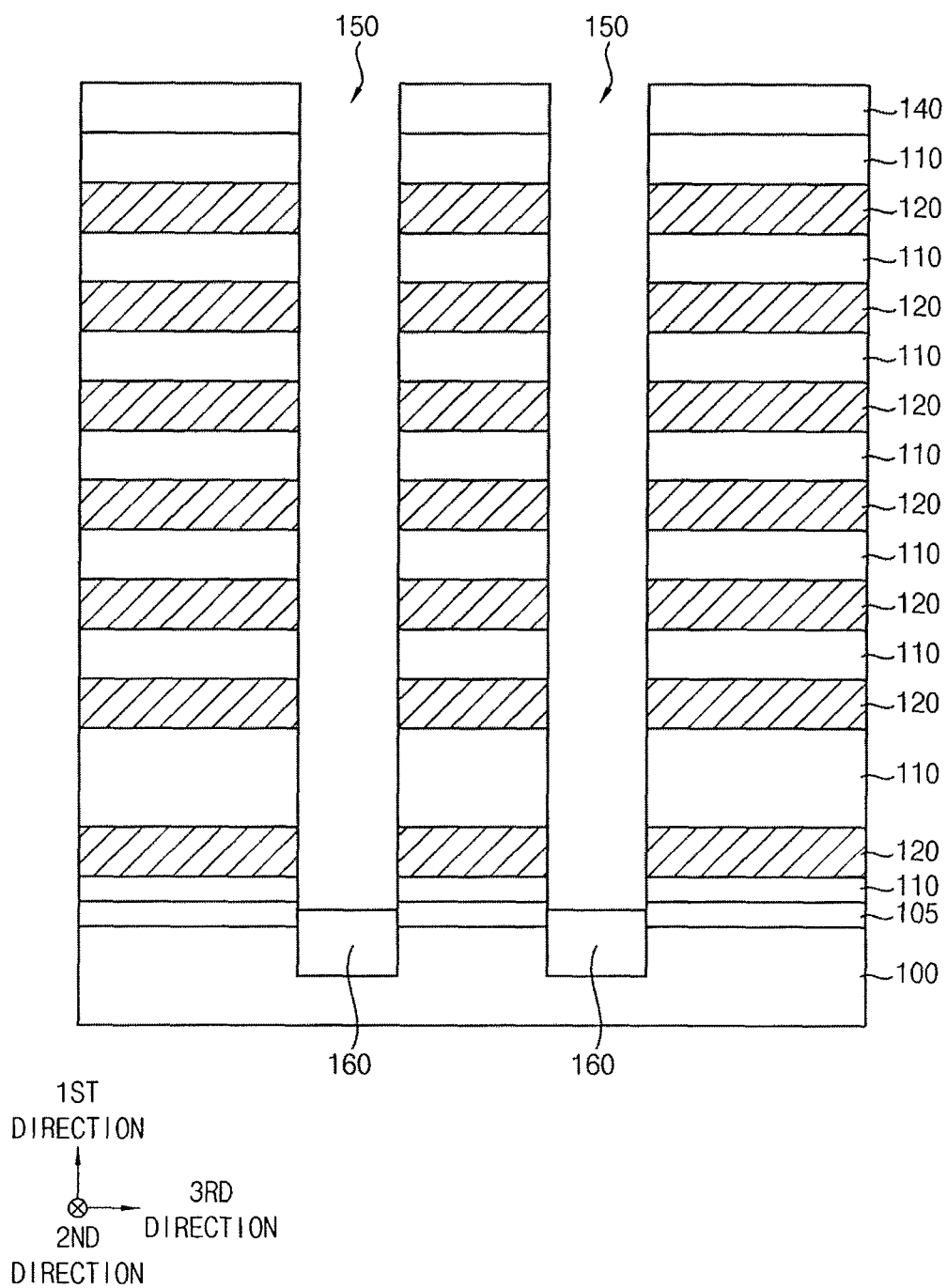

Referring to FIG. 4, after removing the first mask, the first undoped semiconductor pattern 160 may be formed to fill a lower portion of the channel hole 150.

For example, a first selective epitaxial growth (SEG) may be performed using a portion of the substrate 100 exposed by the recess as a seed to form the first undoped semiconductor pattern 160 to partially fill the channel hole 150. Thus, the first undoped semiconductor pattern 160 may include single crystalline silicon, single crystalline germanium, etc., depending on the material of the substrate 100.

In example embodiments, the first SEG process may be performed using a semiconductor source gas, an etching gas, and a carrier gas. In an example embodiment, the semiconductor source gas may include a silicon source gas, e.g., dichlorosilane ($SiH_2Cl_2$) gas, the etching gas may include, e.g., hydrogen chloride (HCl) gas, and the carrier gas may include, e.g., hydrogen ($H_2$) gas. Thus, the first undoped semiconductor pattern 160 may include single crystalline silicon not doped with impurities.

In another example, the first undoped semiconductor pattern 160 may be formed by forming an amorphous semiconductor layer filling the channel hole 150, and performing a laser epitaxial growth (LEG) process or a solid phase epitaxy (SPE) process.

In example embodiments, an upper surface of the first undoped semiconductor pattern 160 may be lower than an upper surface of the substrate 100 on which no recess is formed, e.g., the upper surface of the first undoped semiconductor pattern 160 may be lower than an upper surface of the first impurity region 105 in FIG. 4. In an example embodiment, the upper surface of the first undoped semiconductor pattern 160 may be higher than the lower surface of the first impurity region 105, e.g., relative to the bottom of the substrate 100. However, embodiments are not limited thereto.

Figure 5:
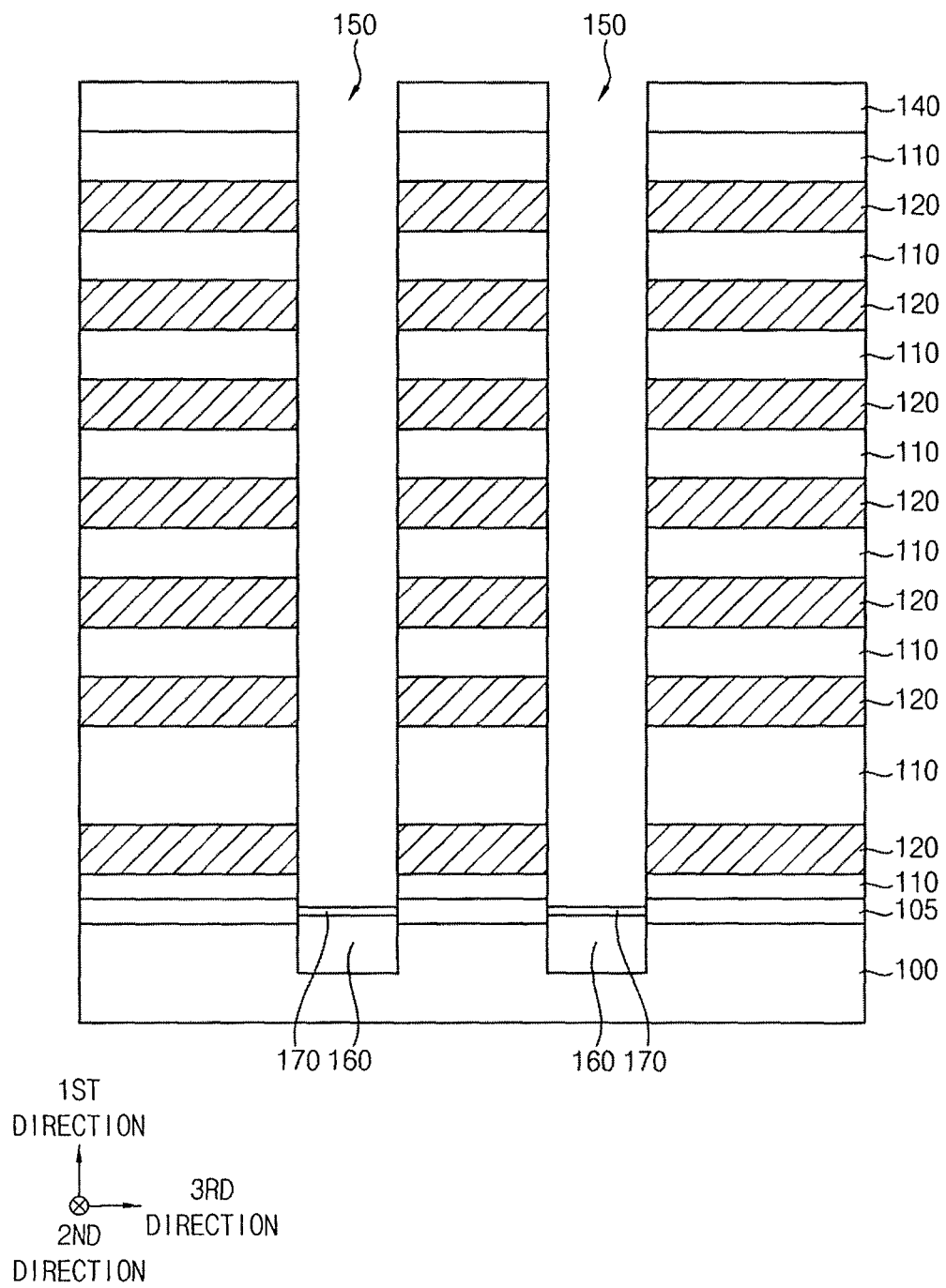

Referring to FIG. 5, a first gas phase deposition (GPD) process may be performed on the first undoped semiconductor pattern 160 to form a first diffusion prevention pattern 170 on the first undoped semiconductor pattern 160.

In example embodiments, the first GPD process may be performed using a carbon source gas, and thus a semiconductor pattern doped with carbon may be formed as the first diffusion prevention pattern 170. When the first undoped semiconductor pattern 160 includes single crystalline silicon, the first diffusion prevention pattern 170 may include single crystalline silicon doped with carbon.

FIG. 5 shows that a lower surface of the first diffusion prevention pattern 170 is higher than the lower surface of the first impurity region 105. However, embodiments are not limited thereto, e.g., the lower surface of the first diffusion prevention pattern 170 may be lower than or substantially coplanar with the lower surface of the first impurity region 105.

Figure 6:
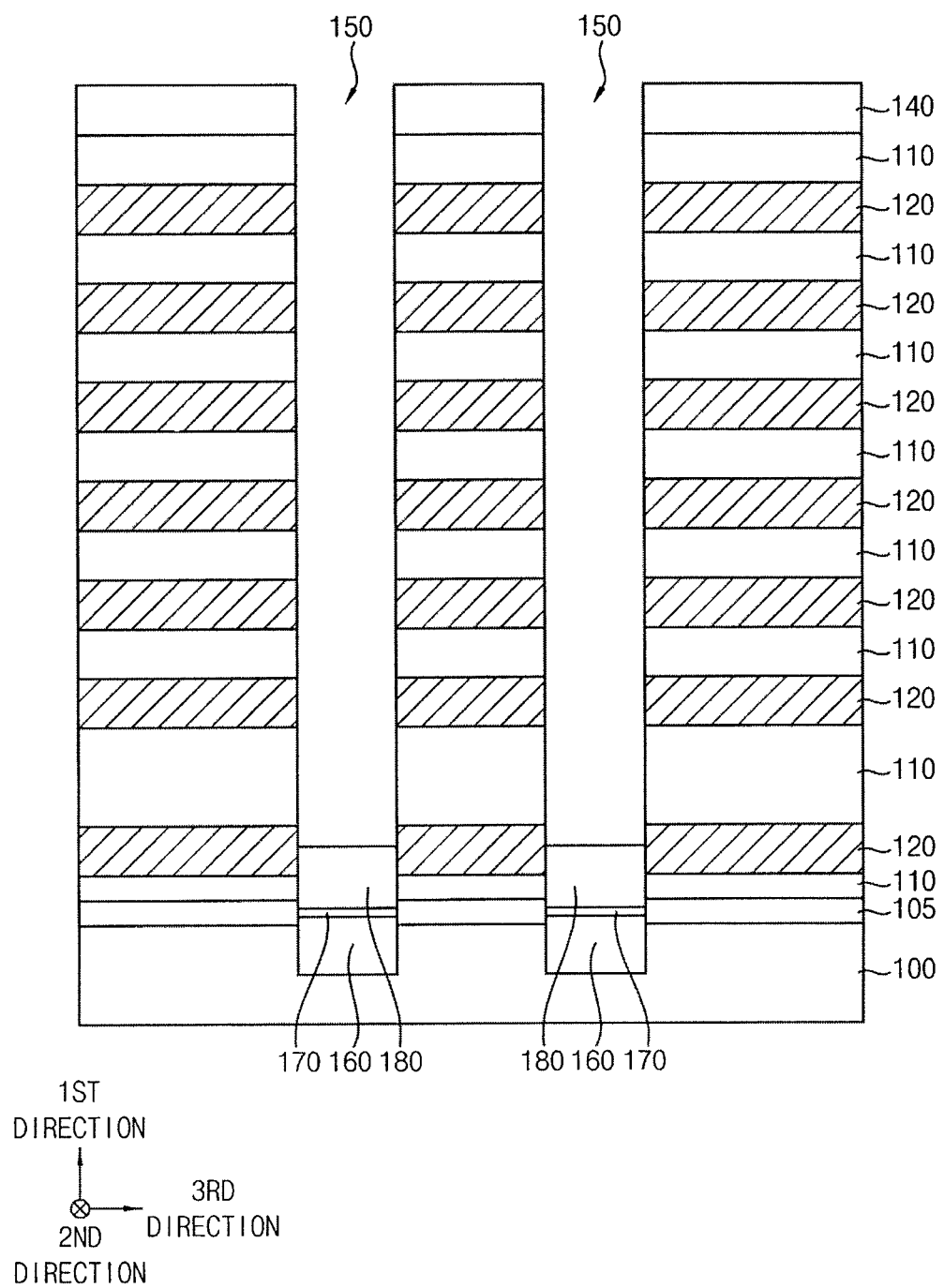

Referring to FIG. 6, the doped semiconductor pattern 180 may be formed on the first diffusion prevention pattern 170 to partially fill the channel hole 150.

In detail, a second SEG process may be performed using the first undoped semiconductor pattern 160, having the first diffusion prevention pattern 170 thereon, as a seed to form the doped semiconductor pattern 180 partially filling the channel hole 150. Thus, the doped semiconductor pattern 180 may include single crystalline silicon, single crystalline germanium, etc., depending on the material of the first undoped semiconductor pattern 160.

In example embodiments, the second SEG process may be performed using a semiconductor source gas, an impurity source gas, an etching gas, and a carrier gas. In an example embodiment, the semiconductor source gas may include a silicon source gas, e.g., dichlorosilane ($SiH_2Cl_2$) gas, the impurity source gas may include a p-type impurity source gas, e.g., diborane ($B_2H_6$) gas, the etching gas may include, e.g., hydrogen chloride (HCl) gas, and the carrier gas may include, e.g., hydrogen ($H_2$) gas. Thus, the doped semiconductor pattern 180 may include single crystalline silicon doped with p-type impurities, e.g., boron.

When the second SEG process for forming the doped semiconductor pattern 180 is performed, the p-type impurity source gas is used, e.g., to provide impurities within the grown doped semiconductor pattern 180. Thus, the doped semiconductor pattern 180 may have a relatively uniform doping concentration in the first direction, or may have a desired doping profile. That is, when compared to an ion implantation process performed to implant impurities into an already formed undoped semiconductor pattern, the impurity source gas in example embodiments is used during the SEG process that forms the doped semiconductor pattern 180, so the doped semiconductor pattern 180 is grown with impurities, i.e., rather than having impurities implanted therein, to have a uniform doping profile or a desired doping profile.

That is, as a plurality of channel holes 150 is formed in the second and third directions, thicknesses or heights of the undoped semiconductor patterns along the first direction, i.e., along the vertical direction with respect to the top surface of the substrate, may have distributions. Thus, if completely undoped semiconductor patterns were to be formed in the bottoms of the channel holes 150, and if impurities were to be implanted into the undoped semiconductor patterns by an ion implantation process, the resultant doped semiconductor patterns would have a doping concentration distribution in the first direction according to the thickness distribution of the undoped semiconductor patterns. In other words, due to the ion implantation process implanting ions to a predetermined depth within the undoped semiconductor patterns along the vertical direction, the resultant doped semiconductor patterns may have a varying doping concentration in the first direction.

However, in accordance with example embodiments, as the doped semiconductor patterns 180 are formed by the second SEG process using the impurity source gas, the doped semiconductor patterns 180 are epitaxially grown with impurities. Thus, the doping concentrations of the doped semiconductor patterns 180 may not be influenced by the thickness distribution of the doped semiconductor patterns 180, and may be relatively uniform, e.g., as compared to impurities ion implanted from an upper portion of the already formed undoped semiconductor pattern.

When the doped semiconductor pattern 180 is formed by the second SEG process, the first diffusion prevention pattern 170 is formed under the doped semiconductor pattern 180, i.e., the first diffusion prevention pattern 170 remains between the first undoped semiconductor pattern 160 and the doped semiconductor pattern 180. Thus, the impurities doped into the doped semiconductor pattern 180 may not diffuse into the underlying first undoped semiconductor pattern 160. Accordingly, the doped semiconductor pattern 180 may have a desired doping profile, and the doping concentration distribution of the doped semiconductor patterns 180 may not increase.

In example embodiments, a lower surface of the doped semiconductor pattern 180 may be lower than the upper surface of the substrate 100, and an upper surface of the doped semiconductor pattern 180 may be higher than a lower surface of the lowermost one of the sacrificial layer 120. Thus, the doped semiconductor pattern 180 may overlap the first impurity region 105 at an upper portion of the substrate 100 and the lowermost one of the sacrificial layers 120 in a horizontal direction substantially parallel to the upper surface of the substrate 100.

In example embodiments, the upper surface of the doped semiconductor pattern 180 may be lower than an upper surface of the lowermost one of the sacrificial layers 120. However, embodiments are not limited thereto.

Figure 7:
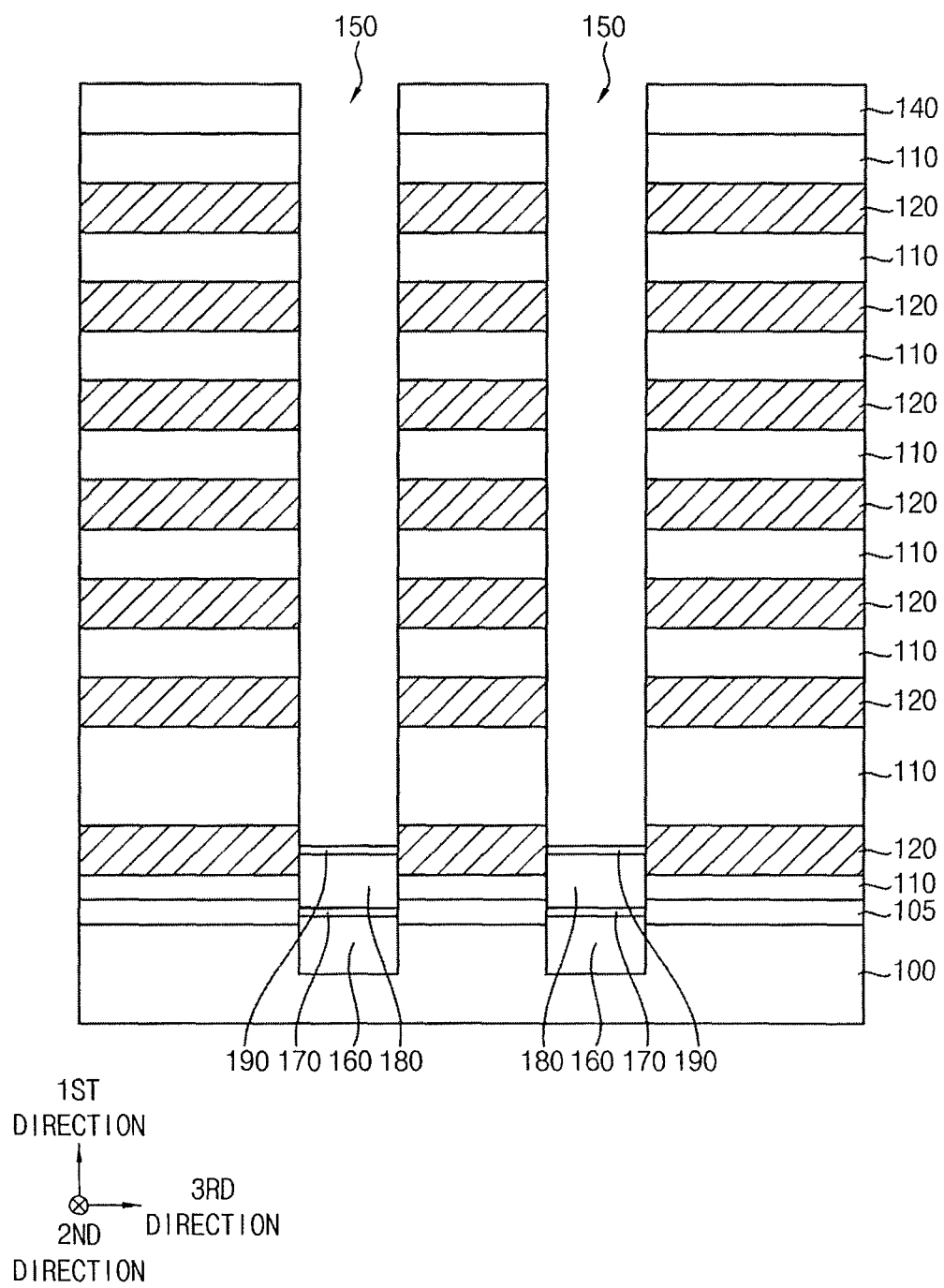

Referring to FIG. 7, a second GPD process may be performed on the doped semiconductor pattern 180 to form the second diffusion prevention pattern 190 on the doped semiconductor pattern 180.

In example embodiments, the second GPD process may be performed using a carbon source gas, and thus a semiconductor pattern doped with carbon and boron may be formed as the second diffusion prevention pattern 190. When the doped semiconductor pattern 180 includes single crystalline silicon, the second diffusion prevention pattern 190 may include single crystalline silicon doped with carbon and boron.

Figure 8:
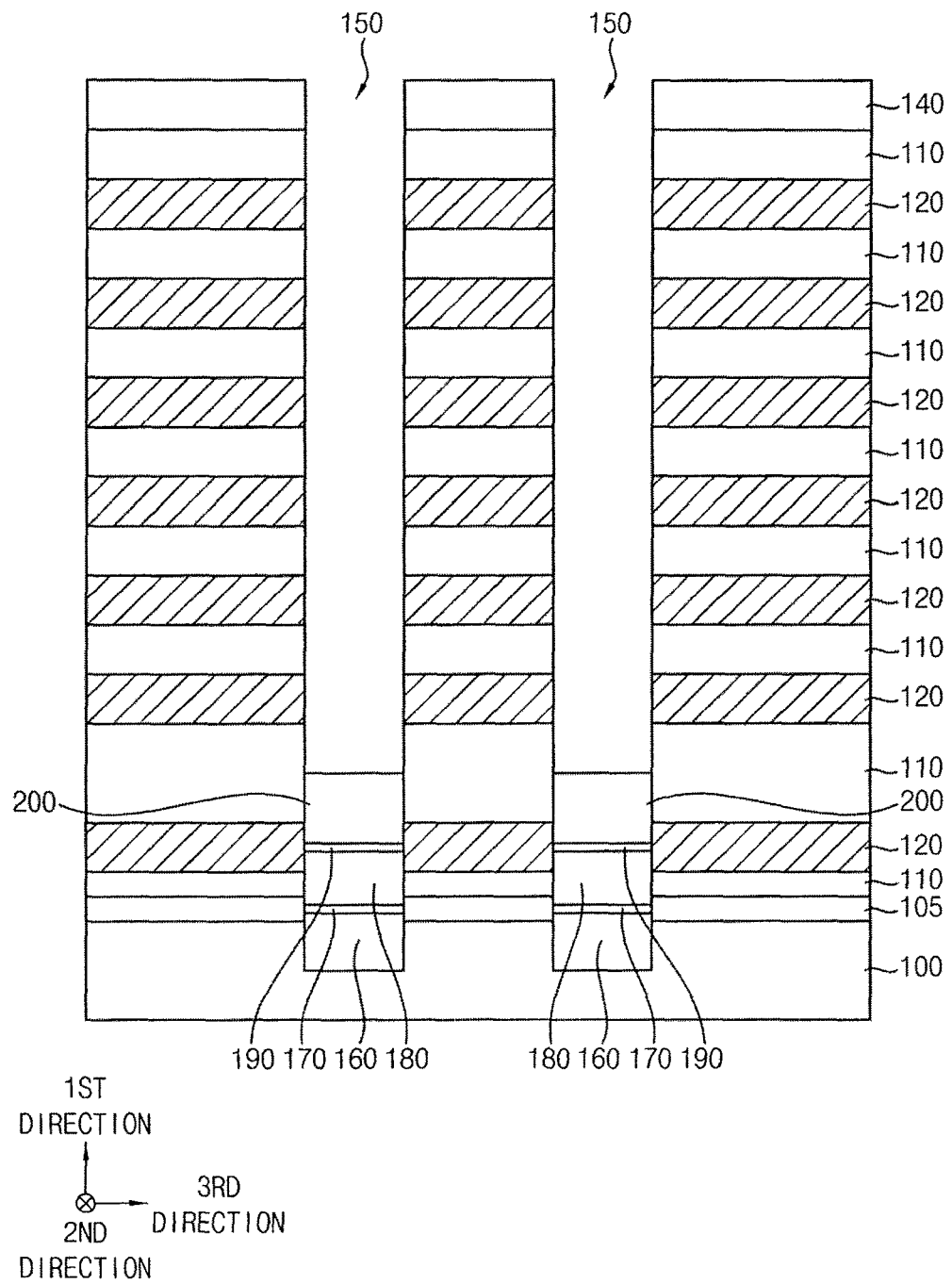

Referring to FIG. 8, the second undoped semiconductor pattern 200 may be formed on the second diffusion prevention pattern 190 to partially fill the channel hole 150.

In detail, a third SEG process may be performed using the doped semiconductor pattern 180 having the second diffusion prevention pattern 190 thereon as a seed to form the second undoped semiconductor pattern 200 partially filling the channel hole 150. Thus, the second undoped semiconductor pattern 200 may include single crystalline silicon, single crystalline germanium, etc., depending on the material of the doped semiconductor pattern 180.

In example embodiments, the third SEG process may be performed using a semiconductor source gas, an etching gas, and a carrier gas like the first SEG process. Thus, the second undoped semiconductor pattern 200 may include single crystalline silicon not doped with impurities.

In example embodiments, a lower surface of the second undoped semiconductor pattern 200 may be lower than the upper surface of the lowermost one of the sacrificial layers 120. However, embodiments are not limited thereto. An upper surface of the second undoped semiconductor pattern 200 may be located between lower and upper surfaces of one of the insulation layers 110 at a second level from the upper surface of the substrate 100 in the first direction.

When the third SEG process is performed, the first and second diffusion prevention patterns 170 and 190 are formed on the lower and upper surfaces of the doped semiconductor pattern 180, respectively, and thus the impurities doped into the doped semiconductor pattern 180 may not diffuse into the first and second undoped semiconductor patterns 160 and 200. Accordingly, the doped semiconductor pattern 180 may maintain the desired doping profile.

The first undoped semiconductor pattern 160, the first diffusion prevention pattern 170, the doped semiconductor pattern 180, the second diffusion prevention pattern 190, and the second undoped semiconductor pattern 200 sequentially stacked on the substrate 100 may form the lower semiconductor pattern structure. The first and second undoped semiconductor patterns 160 and 200 at lower and upper portions of the lower semiconductor pattern structure may not be doped with impurities.

Thus, when compared to a semiconductor pattern formed by a single SEG process with impurities implanted by ion implantation from an upper portion of the semiconductor pattern, only a small portion of the lower semiconductor pattern structure in the example embodiments are doped with impurities in the first direction. Accordingly, the doping profile distribution among the lower semiconductor pattern structures in the respective channel holes 150 may decrease. The doped semiconductor pattern 180 may not be doped by an independent ion implantation process but may be doped during the second SEG process, and thus the doping profile in the plurality of doped semiconductor patterns 180 may not be influenced by the thickness distribution of the doped semiconductor patterns 180 to be relatively uniform.

The lower semiconductor pattern structure may serve as a channel, e.g., like the upper semiconductor pattern 250 subsequently formed. Thus, the lower semiconductor pattern structure and the upper semiconductor pattern 250 may be referred to as the lower channel structure and the upper channel structure, respectively.

Figure 9:
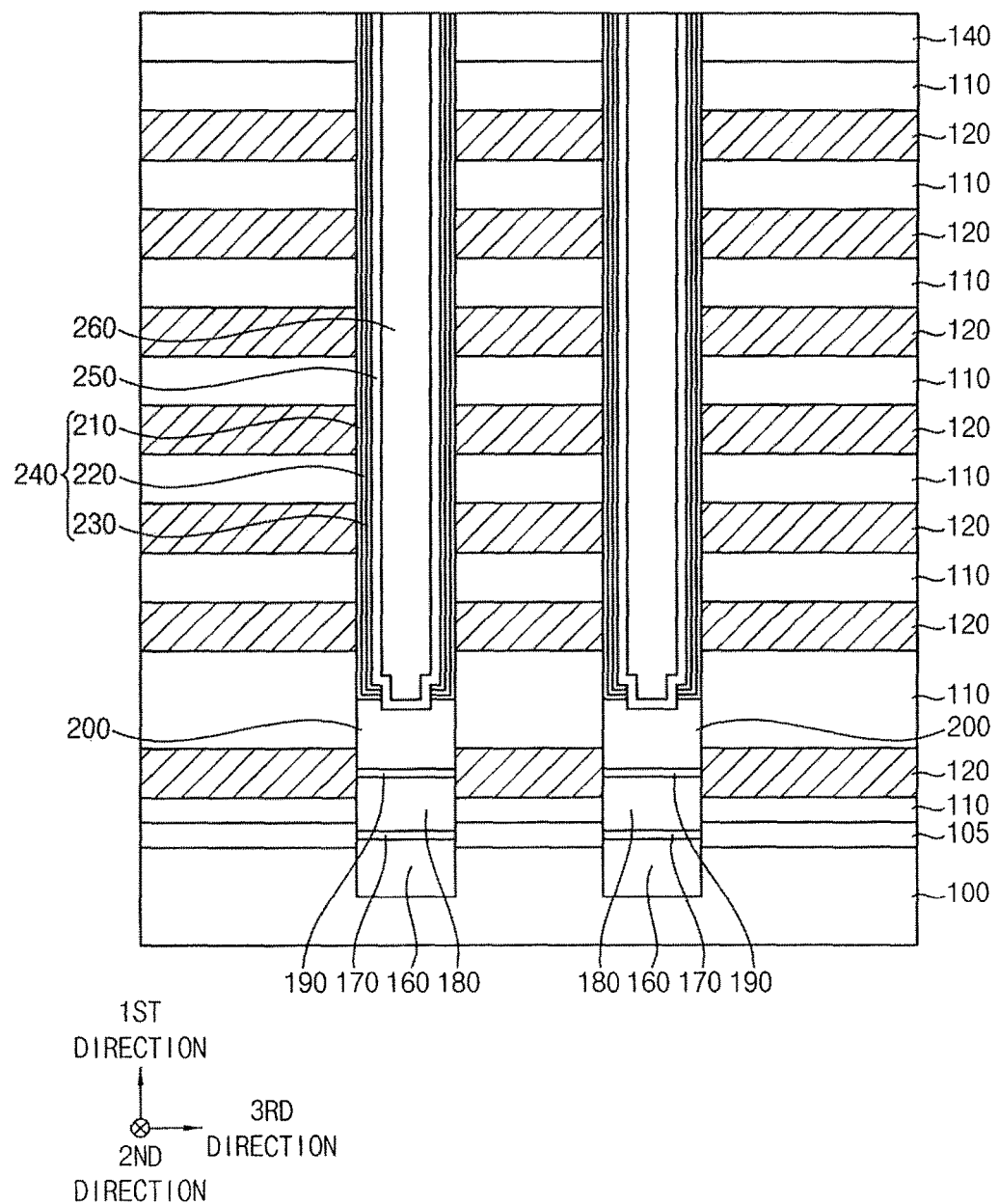

Referring to FIG. 9, a first blocking layer, a charge storage layer, a tunnel insulation layer, and a first spacer layer may be sequentially formed on sidewalls of the channel holes 150, upper surfaces of the lower semiconductor pattern structures, and an upper surface of the second insulating interlayer 140. The first spacer layer may be anisotropically etched to form a first spacer on the sidewalls of the channel holes 150, and the tunnel insulation layer, the charge storage layer, and the first blocking layer may be etched using the first spacer as an etching mask to form the tunnel insulation pattern 230, the charge storage pattern 220, and the first blocking pattern 210, respectively, on the upper surface of the lower semiconductor pattern structure and the sidewall of the channel hole 150, which may have a cup-like shape of which a bottom is opened. During the etching process, an upper portion of the lower semiconductor pattern structure, i.e., the second undoped semiconductor pattern 200, may be also partially removed. The tunnel insulation pattern 230, the charge storage pattern 220, and the first blocking pattern 210 may form the charge storage structure 240. The first blocking layer may be formed of an oxide, e.g., silicon oxide, the charge storage layer may be formed of a nitride, e.g., silicon nitride, the tunnel insulation layer may be formed of an oxide, e.g., silicon oxide, and the first spacer layer may be formed of a nitride, e.g., silicon nitride.

After removing the first spacer, an upper semiconductor layer may be formed on the exposed second undoped semiconductor pattern 200, the tunnel insulation pattern 230, and the second insulating interlayer 140. A filling layer may be formed on the upper semiconductor layer to sufficiently fill remaining portions of the channel holes 150. The upper semiconductor layer may be formed of doped or undoped polysilicon or amorphous silicon. The filling layer may be formed of an oxide, e.g., silicon oxide.

The filling layer and the upper semiconductor layer may be planarized until an upper surface of the second insulating interlayer 140 may be exposed to form a filling pattern 260 filling the remaining portion of each of the channel holes 150, and the upper semiconductor layer may be transformed into an upper semiconductor pattern 250. Thus, the charge storage structure 240, the upper semiconductor pattern 250, and the filling pattern 260 may be sequentially stacked on the lower semiconductor pattern structure in each of the channel holes 150. The charge storage structure 240 may have a cup-like shape of which a bottom is opened, the upper semiconductor pattern 250 may have a cup-like shape, and the filling pattern 260 may have a pillar shape.

As described above, each of the lower semiconductor pattern structure and the upper semiconductor pattern 250 may serve as a channel, and the lower semiconductor pattern structure and the upper semiconductor pattern 250 may form a channel structure. As the channel holes 150 may form the channel hole column, the channel hole block, and the channel hole array, the channel structure may also form a channel structure column, a channel structure block, and a channel structure array.

Figure 10:
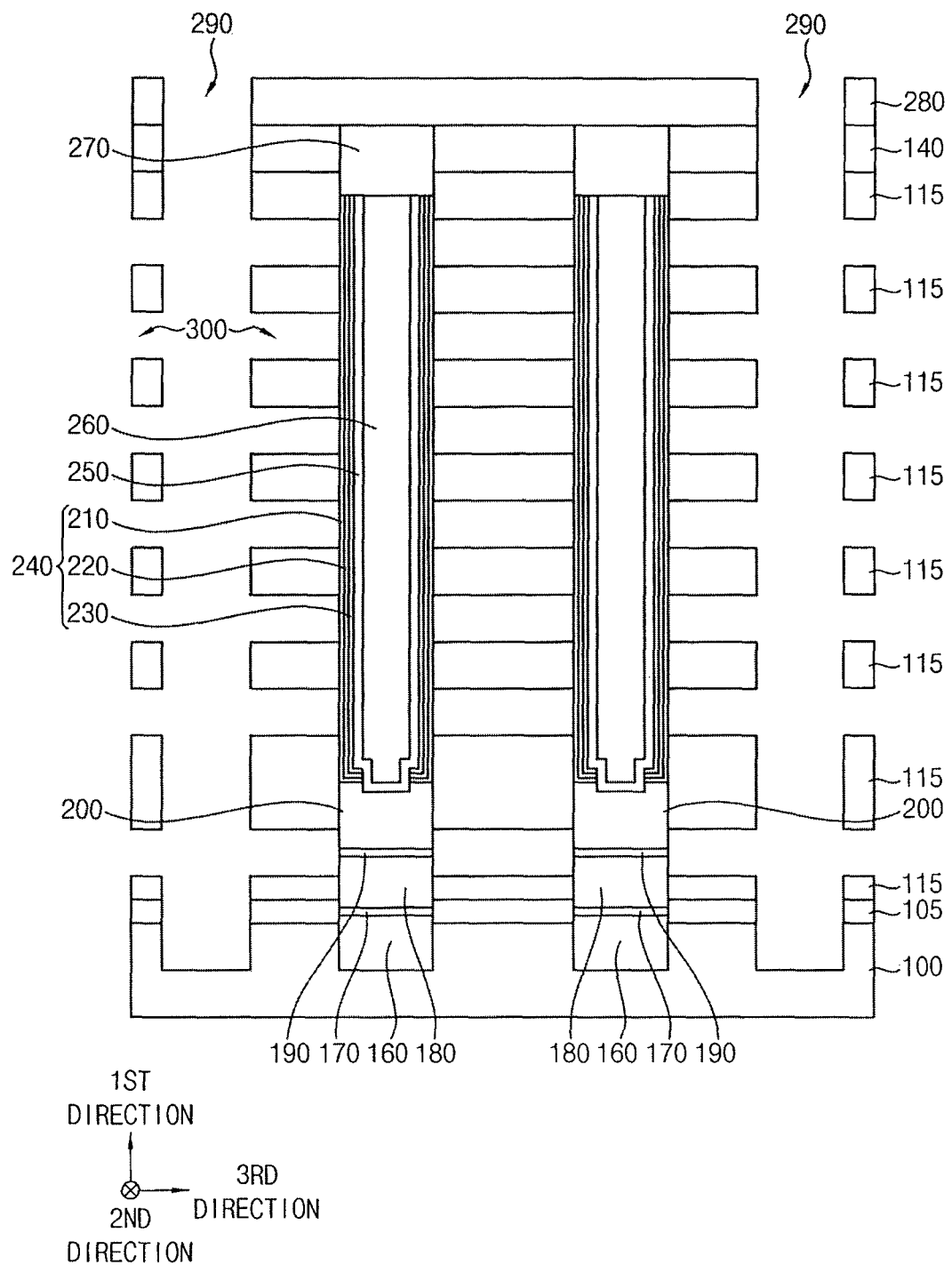

Referring to FIG. 10, an upper portion of the first structure including the filling pattern 260, the channel structure, and the charge storage structure 240 may be removed to form a trench. The capping pattern 270 may be formed to fill the trench.

In detail, after removing the upper portion of the first structure by an etch back process to form the trench, a capping layer filling the trench may be formed on the first structure and the second insulating interlayer 140, and an upper portion of the capping layer may be planarized until the upper surface of the second insulating interlayer 140 may be exposed to form the capping pattern 270. In example embodiments, the capping layer may be formed of doped or undoped polysilicon or amorphous silicon. When the capping layer is formed to include amorphous silicon, a crystallization process may be further performed thereon.

The third insulating interlayer 280 may be formed on the second insulating interlayer 140 and the capping pattern 270, a second mask may be formed on the third insulating interlayer 280, and an opening 290 may be formed through the second and third insulating interlayers 140 and 280, the insulation layers 110, and the sacrificial layers 120 to expose an upper surface of the substrate 100. Accordingly, as the opening 290 extends in the second direction, each of the insulation layers 110 may be transformed into a plurality of insulation patterns 115 spaced apart from each other in the third direction, and each of the insulation patterns 115 may extend in the second direction. Additionally, each of the sacrificial layers 120 may be transformed into a plurality of sacrificial patterns 125 spaced apart from each other in the third direction, and each of the sacrificial patterns 125 may extend in the second direction. The third insulating interlayer 280 may be formed of an oxide, e.g., silicon oxide.

In example embodiments, the opening 290 may extend in the second direction between the channel structure blocks, and a plurality of openings 290 may be forming in the third direction.

After removing the second mask, the sacrificial patterns 125 exposed by the opening 290 may be removed to form a gap 300 between the insulation patterns 115 at respective levels, and a portion of an outer sidewall of the first blocking pattern 210 and a portion of a sidewall of the lower semiconductor pattern structure may be exposed by the gap 300. At least a portion of a sidewall of the doped semiconductor pattern 180 of the lower semiconductor pattern structure may be exposed by the gap 300. In example embodiments, the sacrificial patterns 125 exposed by the gap 300 may be removed by a wet etching process using an etchant including, e.g., phosphoric acid or sulfuric acid.

Figure 11:
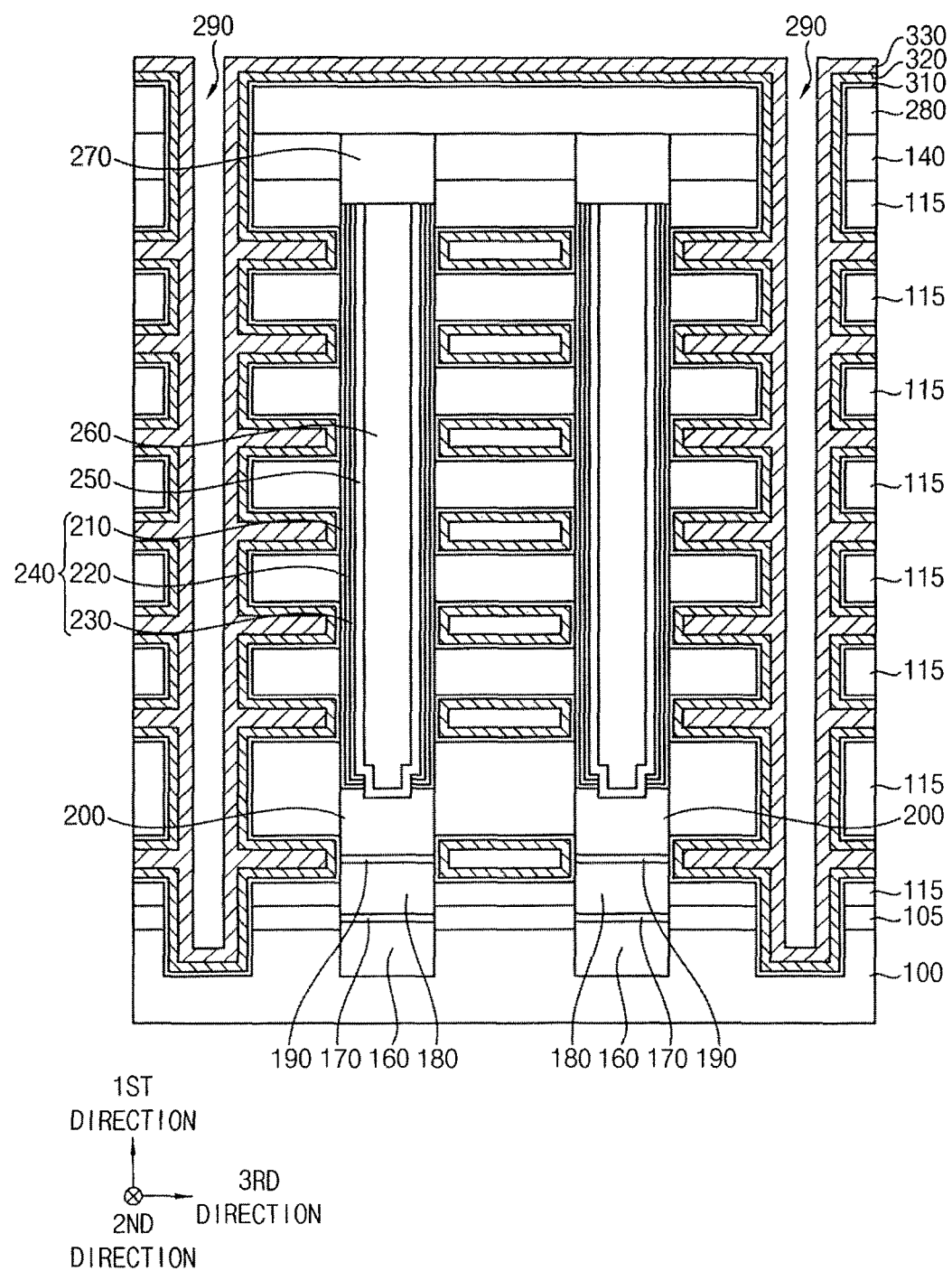

Referring to FIG. 11, after the second blocking layer 310 is formed on the exposed portion of the outer sidewall of the first blocking pattern 210, the exposed portion of the sidewall of the lower semiconductor pattern structure, an inner wall of the gap 300, surfaces of the insulation patterns 115, the exposed upper surface of the substrate 100, and an upper surface of the third insulating interlayer 280, the gate barrier layer 320 may be formed on the second blocking layer 310 The gate conductive layer 330 may be formed on the gate barrier layer 320 to sufficiently fill a remaining portion of the gap 300.

The second blocking layer 310 may be formed of a metal oxide, e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide. The gate conductive layer 330 may be formed of a metal having a low resistance, e.g., tungsten, titanium, tantalum, platinum, etc., and the gate barrier layer 320 may be formed of a metal nitride, e.g., titanium nitride, tantalum nitride, etc. Alternatively, the gate barrier layer 320 may be formed to have a first layer including a metal and a second layer including a metal nitride layer sequentially stacked.

Figure 12:
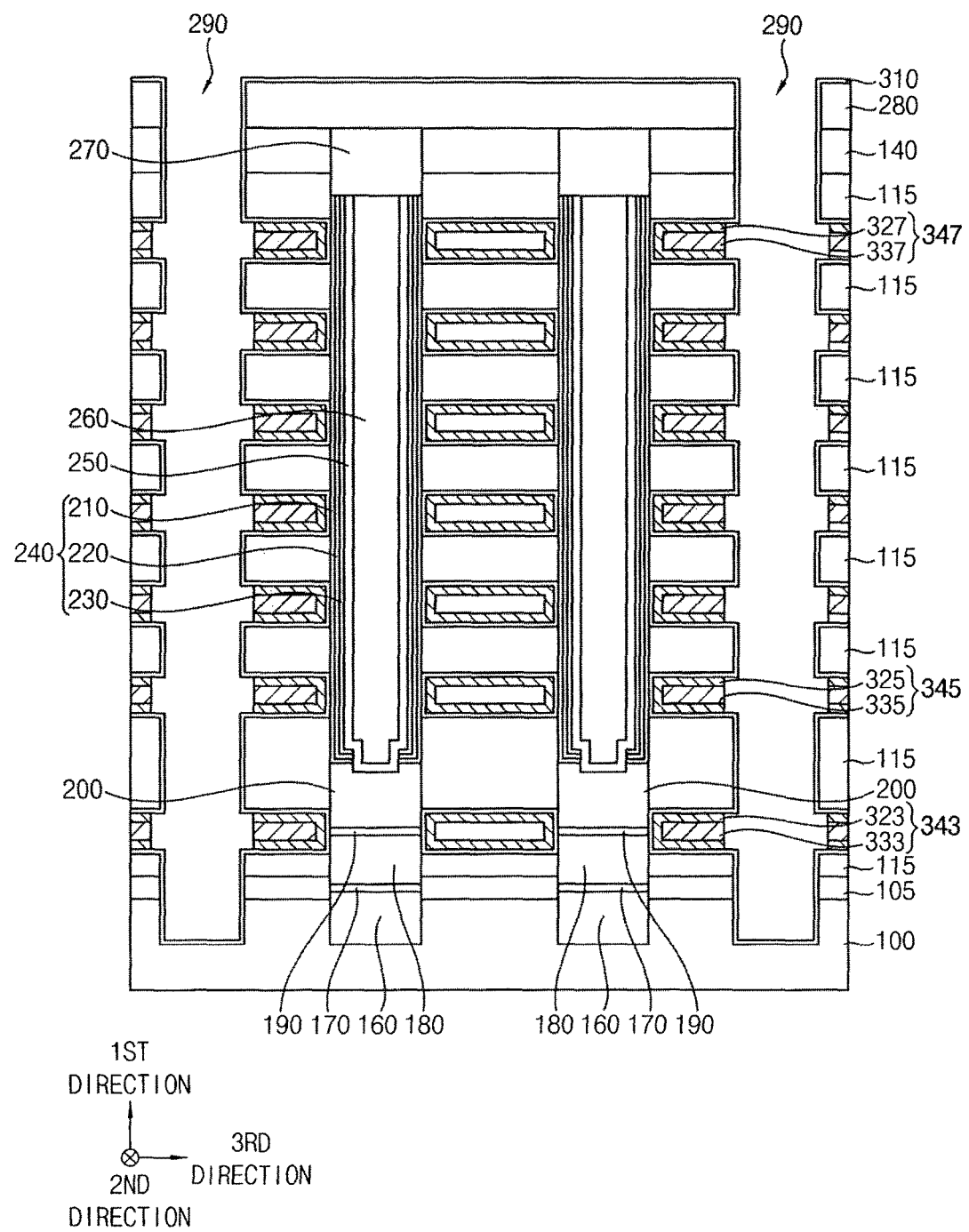

Referring to FIG. 12, the gate conductive layer 330 and the gate barrier layer 320 may be partially removed to form a gate conductive pattern and a gate barrier pattern, respectively, in the gap 300, which may form a gate electrode. In example embodiments, the gate conductive layer 330 and the gate barrier layer 320 may be partially removed by a wet etching process.

In example embodiments, the gate electrode may be formed to extend in the second direction, and a plurality of gate electrodes may be formed in the third direction. That is, a plurality of gate electrodes each extending in the second direction may be spaced apart from each other in the third direction by the opening 290.

The gate electrode may include first, second, and third gate electrodes 343, 345, and 347 sequentially stacked in the first direction. The first gate electrode 343 may serve as a ground selection line (GSL), the second gate electrode 345 may serve as a word line, and the third gate electrode 347 may serve as a string selection lien (SSL). Each of the first to third gate electrodes 343, 345 and 347 may be formed at a single level or a plurality of levels.

In example embodiments, the first gate electrode 343 may be formed at a lowermost level, the third gate electrode 347 may be formed at an uppermost level and a level under the uppermost level, and the second gate electrode 345 may be formed at even levels between the first and third gate electrodes 343 and 347. Thus, the first gate electrode 343 may be formed adjacent the lower semiconductor pattern structure, more particularly, the doped semiconductor pattern 180, and each of the second and third gate electrodes 345 and 347 may be formed adjacent the upper semiconductor pattern 250.

The first gate electrode 343 may include the first gate conductive pattern 333 and the first gate barrier pattern 323 covering lower and upper surfaces and a portion of a sidewall of the first gate conductive pattern 333. The second gate electrode 345 may include the second gate conductive pattern 335 and the second gate barrier pattern 325 covering lower and upper surfaces and a portion of a sidewall of the second gate conductive pattern 335. The third gate electrode 347 may include the third gate conductive pattern 337 and the third gate barrier pattern 327 covering lower and upper surfaces and a portion of a sidewall of the third gate conductive pattern 337.

FIG. 12 shows that the second blocking layer 310 is not removed but extends in the first direction. However, embodiments are not limited thereto. That is, the second blocking layer 310 may be partially removed, and a second blocking pattern only on the inner walls of the gaps 300 may be formed.

Figure 13:
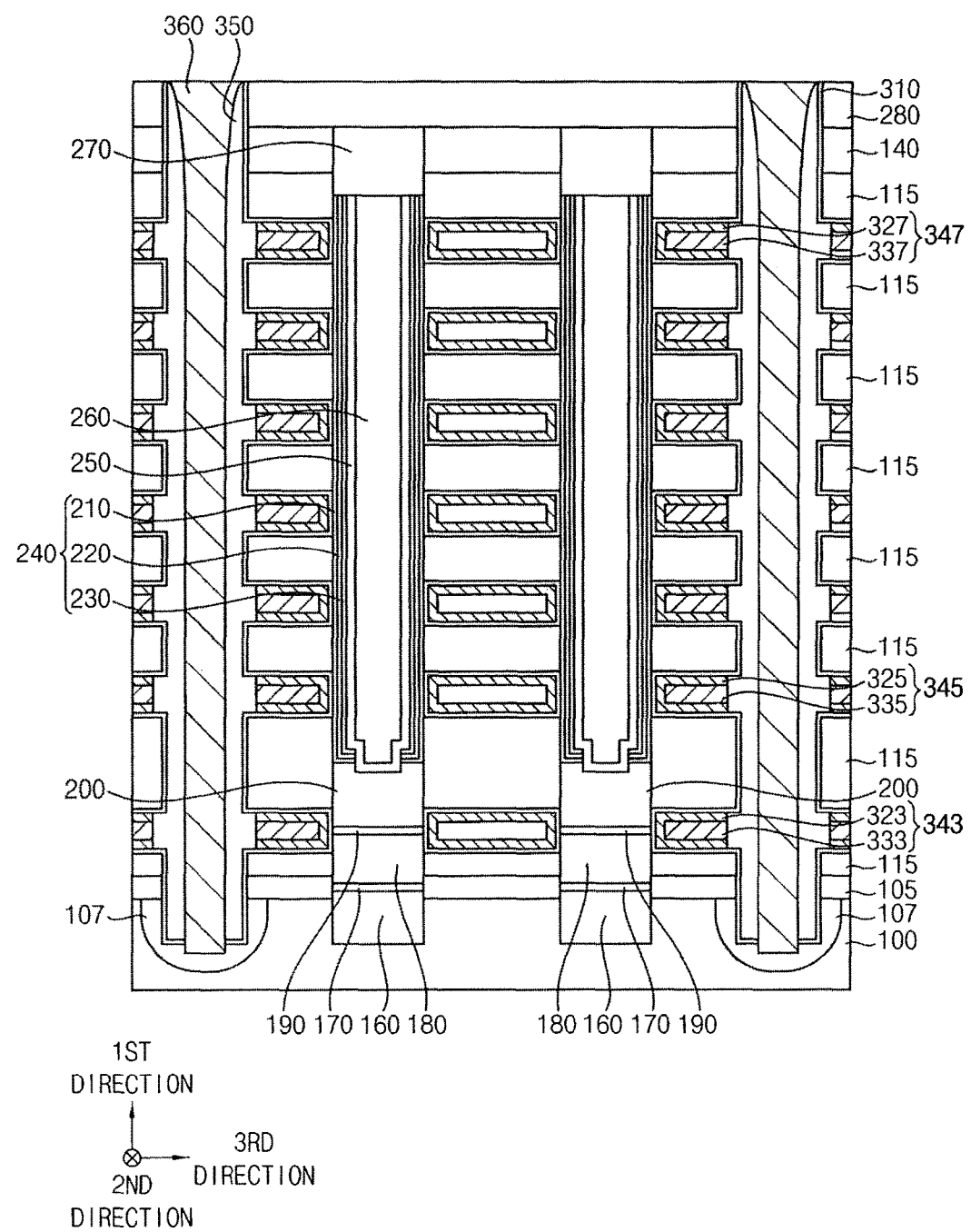

Referring to FIG. 13, impurities may be implanted into an upper portion of the substrate 100 exposed by the opening 290 to form the second impurity region 107. In example embodiments, the impurities may include n-type impurities, e.g., phosphorus, arsenic, etc.

A second spacer layer may be formed on the exposed upper surface of the opening 290, an upper surface of the second impurity region 107, a sidewall of the opening 290, and an upper surface of the third insulating interlayer 280. The second spacer layer may be anisotropically etched to form the second spacer 350 on the sidewall of the opening 290. Thus, a portion of the second impurity region 107 at an upper portion of the substrate 100 may be exposed. The second spacer layer may be formed of an oxide, e.g., silicon oxide.

The CSL 360 may be formed on the exposed second impurity region 107 to fill a remaining portion of the opening 290. In example embodiments, a conductive layer may be formed on the exposed upper surface of the second impurity region 107, the second spacer 350, and the third insulating interlayer 280 to sufficiently fill a remaining portion of the opening 290, and may be planarized until an upper surface of the third insulating interlayer 280 may be exposed to form the CSL 360. A portion of the second blocking layer 310 on the third insulating interlayer 280 may be also removed. The conductive layer may be formed of, e.g., a metal, a metal nitride and/or a metal silicide.

Referring to FIG. 1 again, the fourth insulating interlayer 370 may be formed on the third insulating interlayer 280, the CSL 360, the second spacer 350 and the second blocking layer 310. The contact plug 380 may be formed through the third and fourth insulating interlayers 280 and 370 to contact the capping pattern 270.

The fourth insulating interlayer 370 may be formed of an oxide, e.g., silicon oxide, and thus may be merged with the underlying third insulating interlayer 280. The contact plug 380 may be formed of a metal, e.g., tungsten, tantalum, titanium, etc., or a metal nitride, e.g., titanium nitride, tantalum nitride, tungsten nitride, etc.

A fifth insulating interlayer may be formed on the fourth insulating interlayer 370 and the contact plug 380, and a bit line 390 may be formed through the fifth insulating interlayer. In example embodiments, the bit line 390 may be formed by a damascene process, and may be formed of a metal, e.g., tungsten, tantalum, titanium, etc., or a metal nitride, e.g., titanium nitride, tantalum nitride, tungsten nitride, etc.

The bit line 390 may contact an upper surface of the contact plug 380. In example embodiments, the bit line 390 may extend in the third direction, and a plurality of bit lines 390 may be formed in the second direction.

By the above processes, the vertical memory device may be manufactured. As described above, the lower semiconductor pattern structure 251 of the example embodiments is not formed by performing a single SEG process followed by an ion implantation process. Therefore, the thickness distribution or height distribution that may be generated in lower semiconductor pattern structures due to ion implantation, e.g., causing different doping profiles of impurities in different lower semiconductor pattern structure, may be prevented or substantially minimized.

However, in accordance with example embodiments, the lower semiconductor pattern structure 251 may be formed by a plurality of SEG processes, and impurities may be doped only in some of the SEG processes. Thus, when compared to impurities doped into whole portions of the lower semiconductor pattern structures via ion implantation, the impurity doping profile distributions among the lower semiconductor pattern structures 251 may decrease since the impurities are doped into only a portion of the lower semiconductor pattern structure 251, e.g., only into the doped semiconductor pattern 180. Additionally, impurities may not be implanted into the doped semiconductor pattern 180 by an ion implantation process, but via an impurity source gas used in the SEG process, thereby providing a desired impurity doping profile. The first and second diffusion prevention patterns 170 and 190 may be formed under and on the doped semiconductor pattern 180, respectively, and thus the impurities doped into the doped semiconductor pattern 180 may not diffuse into the first and second undoped semiconductor patterns 160 and 200 by the SEG process or a heat treatment process. Accordingly, the desired impurity doping profile in the doped semiconductor pattern 180 may be maintained.

FIGS. 14 to 17 are cross-sectional views illustrating vertical memory devices in accordance with example embodiments. The vertical memory devices may be substantially the same as that of FIG. 1, except for the shape of the lower semiconductor pattern structure or the charge storage structure. Thus, like reference numerals refer to like elements, and detailed descriptions thereof are omitted herein.

Figure 14:
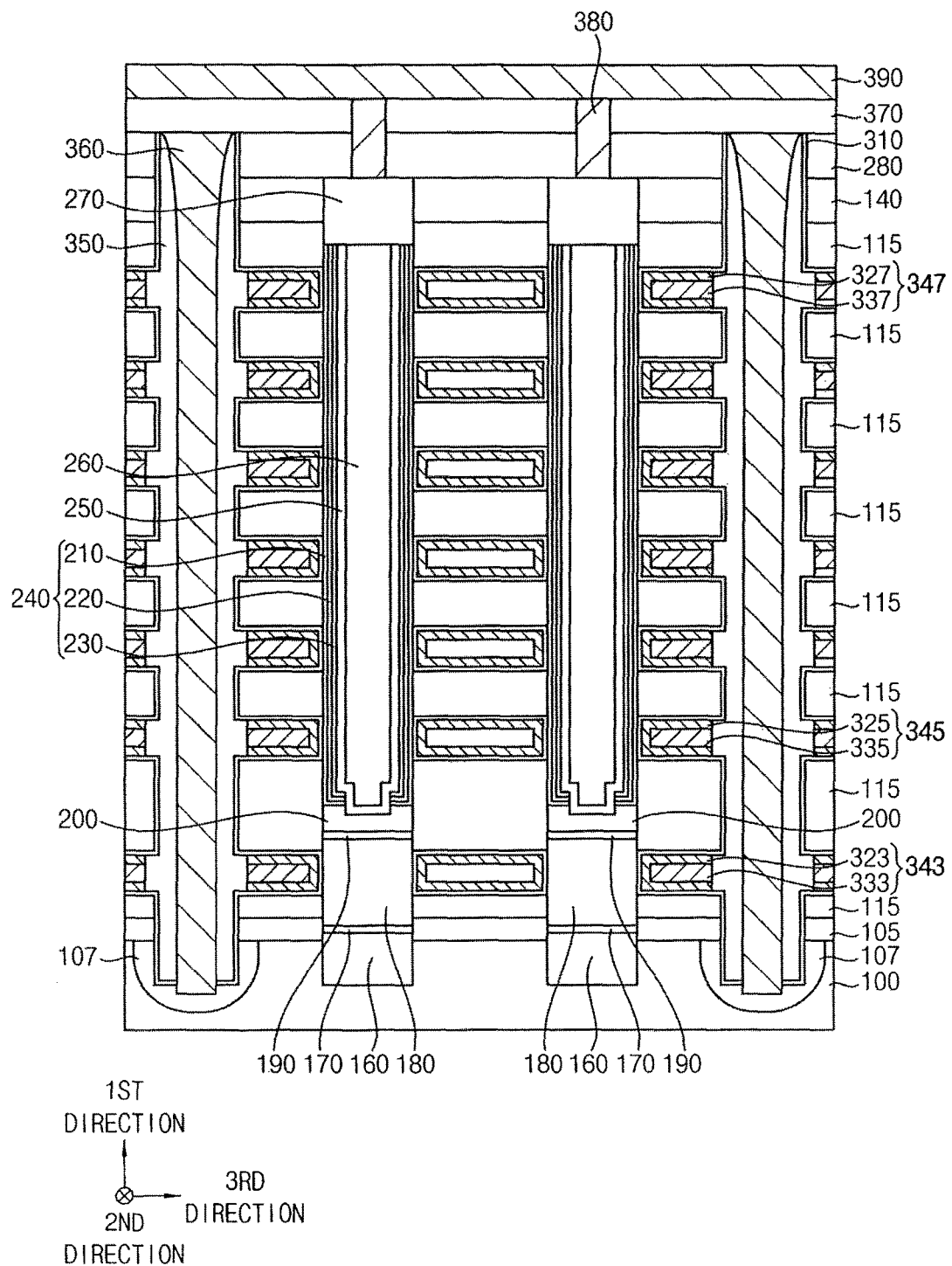
FIGS. 14 to 17 illustrate cross-sectional views of vertical memory devices in accordance with example embodiments.

Referring to FIG. 14, an upper surface of the doped semiconductor pattern 180 may be higher than an upper surface of the first gate electrode 343, and thus the second diffusion prevention pattern 190 on the doped semiconductor pattern 180 may be located between lower and upper surfaces of one of the insulation patterns 115 at a second level from the upper surface of the substrate 100 in the first direction.

The doped semiconductor pattern 180 may have a thickness greater than in FIG. 1, and thus the impurity concentration distribution among the plurality of lower semiconductor pattern structures may be relatively large. However, as the doped semiconductor pattern 180 overlaps not only a portion but the whole, e.g., entire sidewall, of the first gate electrode 343 in a horizontal direction, the doped semiconductor pattern 180 may have stable electrical characteristics in a GST.

Figure 15:
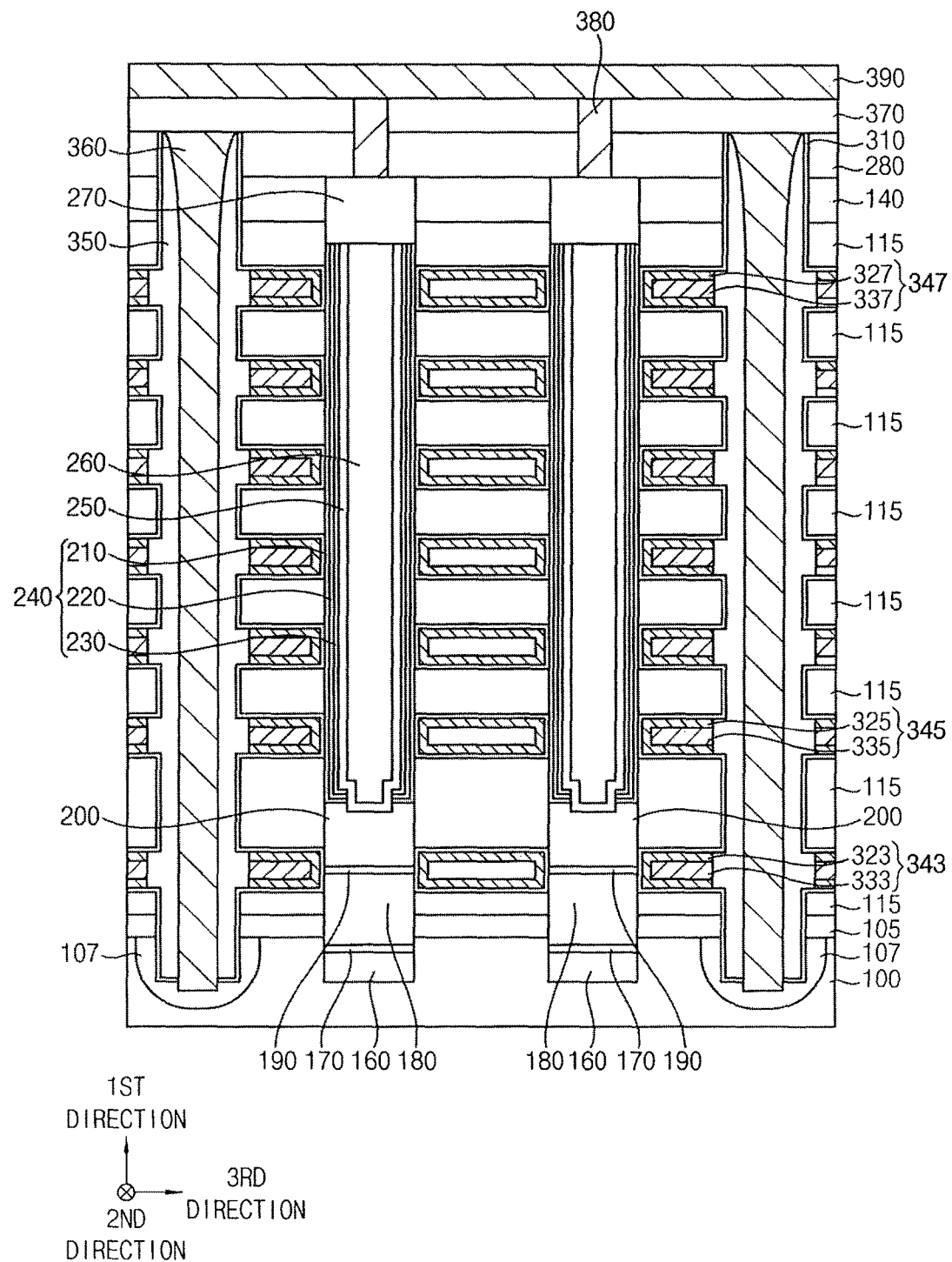

Referring to FIG. 15, a lower surface of the doped semiconductor pattern 180 may be lower than a lower surface of the first impurity region 105, and thus the first diffusion prevention pattern 170 under the doped semiconductor pattern 180 may be lower than the first impurity region 105.

The doped semiconductor pattern 180 may have a thickness greater than in FIG. 1, and thus the impurity concentration distribution among the plurality of lower semiconductor pattern structures may be relatively large. However, as the doped semiconductor pattern 180 overlaps not only a portion but the whole, e.g., entire sidewall, of the first impurity region 105 in a horizontal direction, the doped semiconductor pattern 180 may have stable electrical characteristics in a GST.

Figure 16:
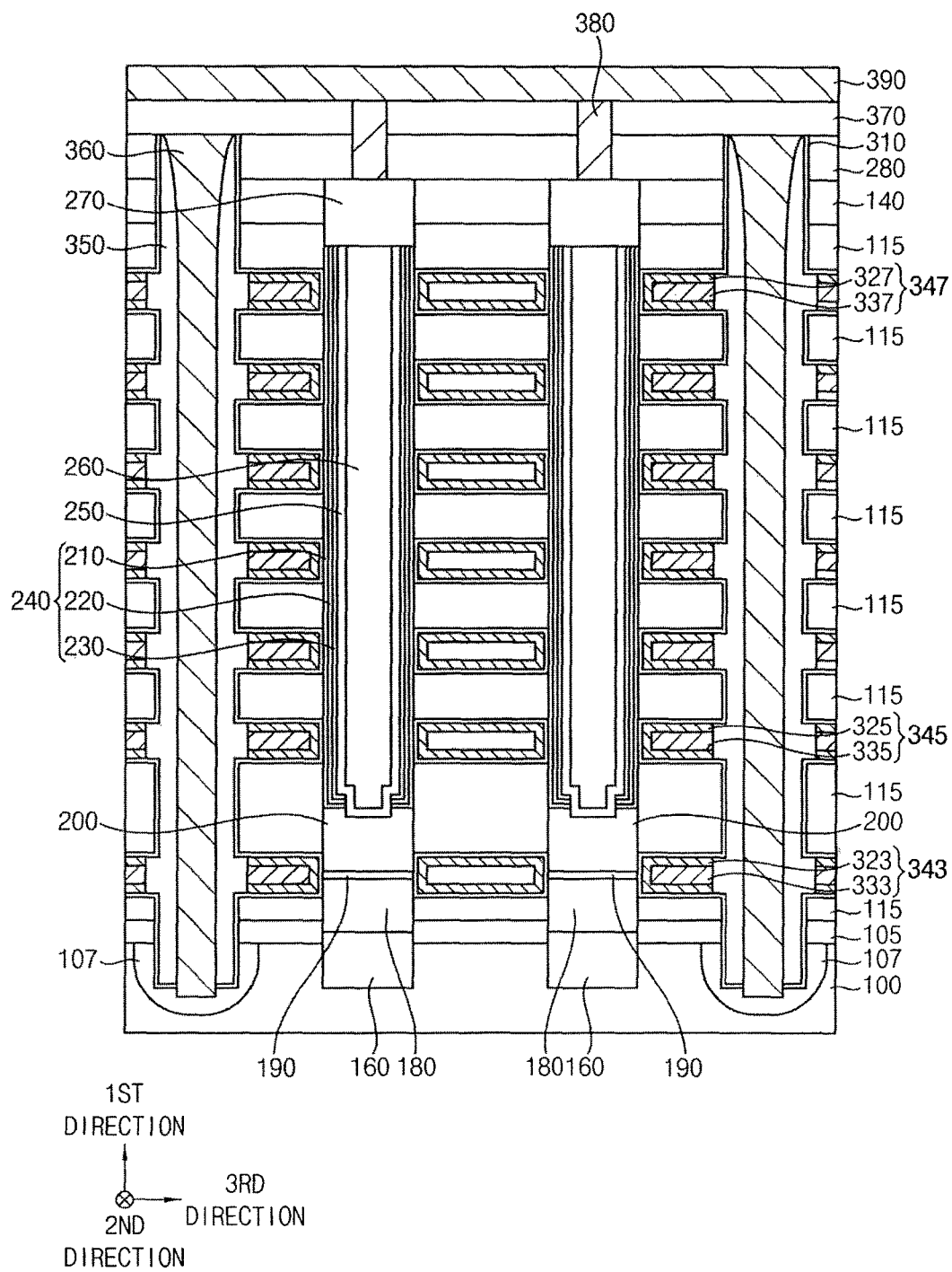

Referring to FIG. 16, the lower semiconductor pattern structure may not include the first diffusion prevention pattern 170, and thus the first undoped semiconductor pattern 160 and the doped semiconductor pattern 180 may directly contact each other.

In the doped semiconductor pattern 180, impurities may diffuse into the underlying first undoped semiconductor pattern 160 by a heat treatment process so that the impurity doping profile may be changed when compared to that of FIG. 1. However, as each of the plurality of lower semiconductor pattern structures may not include the first diffusion prevention pattern 170 but still includes the second diffusion prevention pattern 190, the impurity doping profile distribution among the plurality of lower semiconductor pattern structures may not be so large.

Figure 17:
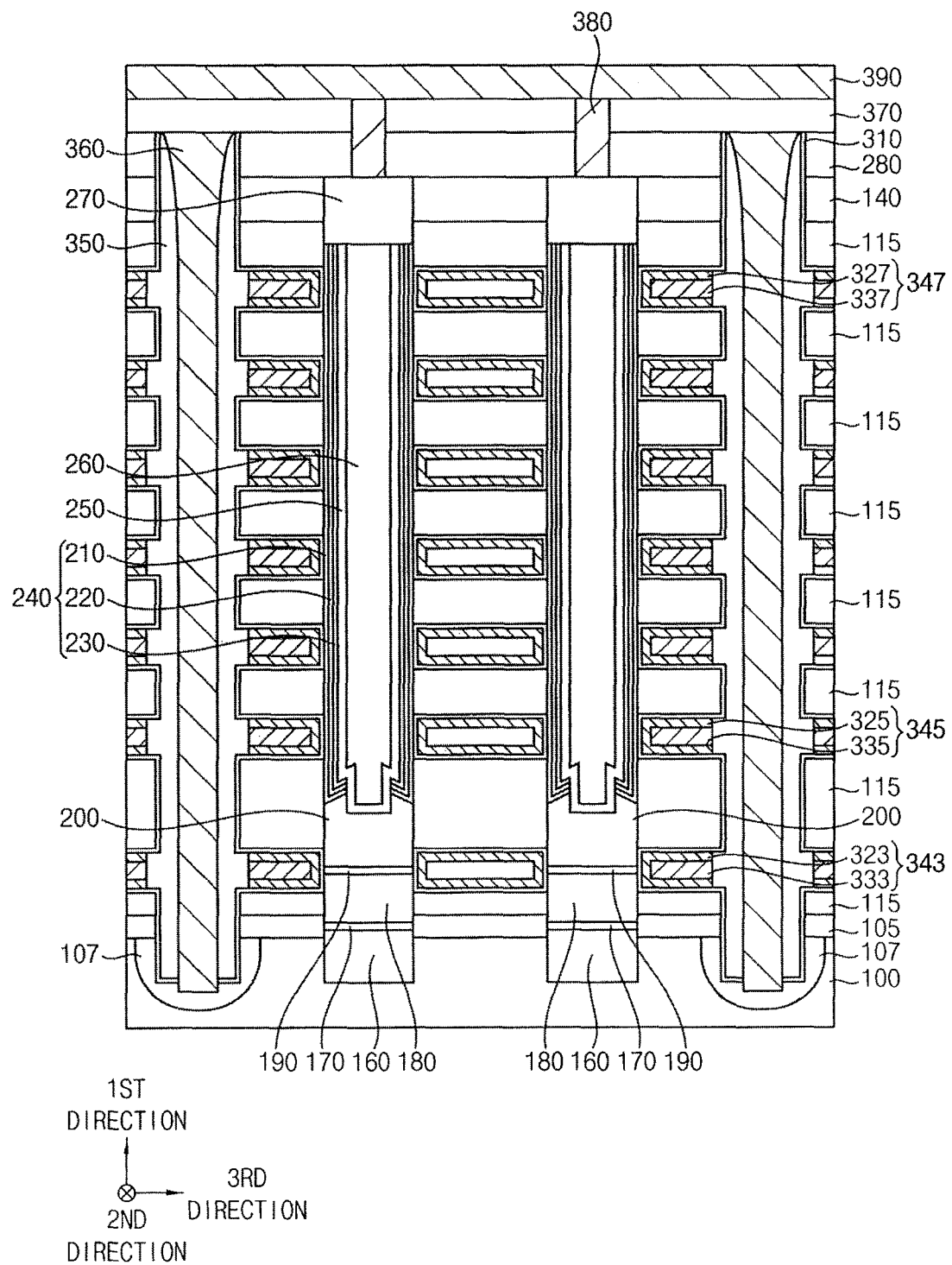

Referring to FIG. 17, an upper surface of the second undoped semiconductor pattern 200 may not be parallel to the upper surface of the substrate 100 but may be slanted with respect to the upper surface of the substrate 100. The slanted upper surface of the second undoped semiconductor pattern 200 may be generated due to the characteristics of the SEG process, and thus a lower surface of the charge storage structure 240 may be slanted. The first undoped semiconductor pattern 160 and the doped semiconductor pattern 180, which may be formed by a SEG process, may have also slanted upper surfaces.

Figure 18:
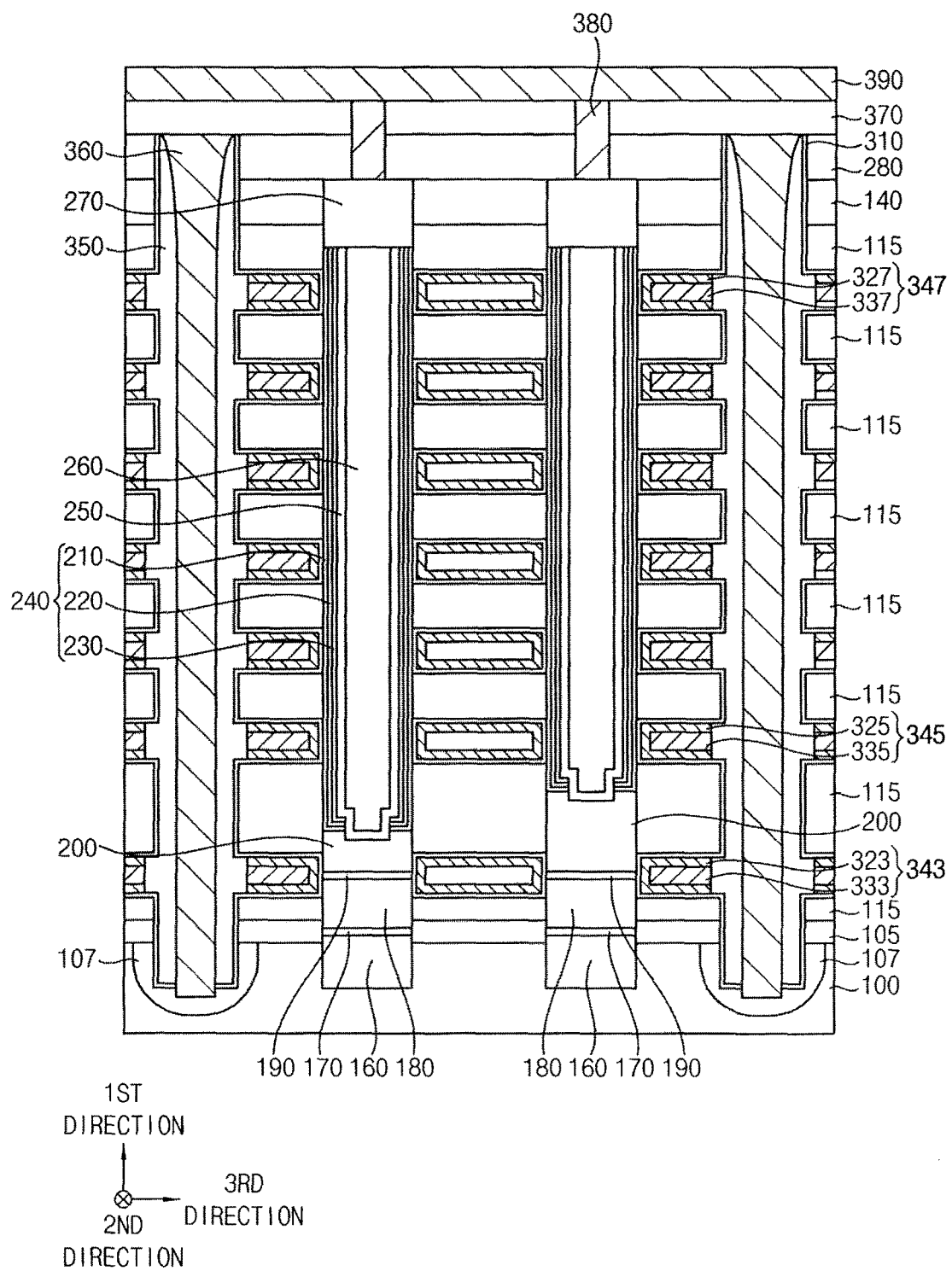
FIG. 18 illustrates a cross-sectional view of vertical memory devices in accordance with example embodiments.

FIG. 18 is a cross-sectional view illustrating vertical memory devices in accordance with example embodiments.

Referring to FIG. 18, upper surfaces of the plurality of second undoped semiconductor patterns 200 may have different heights from each other.

As illustrated with reference to FIG. 18, when the second undoped semiconductor patterns 200 are formed on the respective second diffusion prevention patterns 190 to partially fill the channel holes 150, the second undoped semiconductor patterns 200 in the respective channel holes 150 may have different heights from each other. However, upper surfaces of the second undoped semiconductor patterns 200 may be located between lower and upper surfaces of one of the insulation patterns 115 at a second level from the upper surface of the substrate 100 in the first direction.

No impurities may be doped into the second undoped semiconductor patterns 200. Therefore, the second undoped semiconductor patterns 200 may not serve as channels of GSTs, and thus the height distribution of the second undoped semiconductor patterns 200 may not influence the characteristic distribution of the GSTs.

By way of summation and review, when a single SEG process is performed, the semiconductor patterns may have height distributions. Further, when such resultant semiconductor patterns are implanted with impurities via ion implantation, there may be impurity concentration distributions in the resultant doped semiconductor patterns. Thus, threshold voltage distributions may be generated between GSTs adjacent to the semiconductor patterns.

Therefore, example embodiments provide a vertical memory device having good characteristics, and a method of manufacturing the same. That is, example embodiments provide a vertical memory device with impurities doped into only portions of the lower semiconductor pattern structures serving as channels of GSTs, and thus the impurity concentration distribution of the plurality of lower semiconductor pattern structures may decrease. Accordingly, the characteristic distribution between the GSTs may be enhanced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical memory device, comprising:
   a first structure including:
      a lower semiconductor pattern structure filling a recess on a substrate and protruding from an upper surface of the substrate in a first direction substantially perpendicular to the upper surface of the substrate, the lower semiconductor pattern structure including a first undoped semiconductor pattern, a doped semiconductor pattern, and a second undoped semiconductor pattern sequentially stacked, and a lower surface of the doped semiconductor pattern being lower than the upper surface of the substrate, and
      an upper semiconductor pattern extending in the first direction on the lower semiconductor pattern structure; and
   a plurality of gate electrodes surrounding a sidewall of the first structure, the plurality of gate electrodes being at a plurality of levels, respectively, so as to be spaced apart from each other in the first direction,
   wherein an upper surface of the doped semiconductor pattern of the lower semiconductor pattern is higher than a lower surface of a lowermost one of the plurality of gate electrodes and lower than an upper surface thereof.

2. The vertical memory device as claimed in claim 1, wherein an upper surface of the second undoped semiconductor pattern is higher than the upper surface of the lowermost one of the plurality of gate electrodes.

3. The vertical memory device as claimed in claim 1, further comprising:
   a first diffusion prevention pattern between the first undoped semiconductor pattern and the doped semiconductor pattern; and
   a second diffusion prevention pattern between the doped semiconductor pattern and the second undoped semiconductor pattern.

4. The vertical memory device as claimed in claim 3, wherein each of the first and second diffusion prevention patterns is a semiconductor pattern doped with carbon.

5. The vertical memory device as claimed in claim 4, wherein the second diffusion prevention pattern is a semiconductor pattern doped with carbon and boron.

6. The vertical memory device as claimed in claim 1, further comprising an impurity layer at an upper portion of the substrate.

7. The vertical memory device as claimed in claim 6, wherein the doped semiconductor pattern contacts the impurity layer.

8. The vertical memory device as claimed in claim 6, wherein a lower surface of the doped semiconductor pattern is higher than a lower surface of the impurity layer.

9. The vertical memory device as claimed in claim 6, wherein a lower surface of the doped semiconductor pattern is lower than a lower surface of the impurity layer.

10. The vertical memory device as claimed in claim 6, wherein the impurity layer includes p-type impurities.

11. A vertical memory device, comprising:
    a first structure including:
       a lower semiconductor pattern structure filling a recess on a substrate and protruding from an upper surface of the substrate in a first direction substantially perpendicular to the upper surface of the substrate, the lower semiconductor pattern structure including a first undoped semiconductor pattern, a doped semiconductor pattern, a diffusion prevention pattern, and a second undoped semiconductor pattern sequentially stacked, the doped semiconductor pattern including a silicon pattern doped with p-type impurities, and the diffusion prevention pattern including a silicon pattern doped with carbon and the p-type impurities, and
       an upper semiconductor pattern extending in the first direction on the lower semiconductor pattern structure; and
    a plurality of gate electrodes surrounding a sidewall of the first structure, the plurality of gate electrodes being at a plurality of levels, respectively, so as to be spaced apart from each other in the first direction,
    wherein an upper surface of the doped semiconductor pattern of the lower semiconductor pattern is higher than a lower surface of a lowermost one of the plurality of gate electrodes and lower than an upper surface thereof.

12. The vertical memory device as claimed in claim 11, wherein:

the diffusion prevention pattern is a second diffusion prevention pattern, and the vertical memory device further comprises a first diffusion prevention pattern between the first undoped semiconductor pattern and the doped semiconductor pattern, the first diffusion prevention pattern including a silicon pattern doped with carbon.

13. The vertical memory device as claimed in claim 11, wherein a lower surface of the doped semiconductor pattern is lower than the upper surface of the substrate.

14. A vertical memory device, comprising:

a first structure including a lower semiconductor pattern structure filling a recess on a substrate and protruding above an upper surface of the substrate, the lower semiconductor pattern structure including a first undoped semiconductor pattern, a doped semiconductor pattern, and a second undoped semiconductor pattern sequentially stacked, only the doped semiconductor pattern including impurities among the first undoped semiconductor pattern, the doped semiconductor pattern, and the second undoped semiconductor pattern;

an upper semiconductor pattern on the lower semiconductor pattern structure; and a plurality of gate electrodes surrounding a sidewall of the first structure, the plurality of gate electrodes being at a plurality of levels, respectively, so as to be spaced apart from each other in the first direction, wherein an upper surface of the doped semiconductor pattern of the lower semiconductor pattern is higher than a lower surface of a lowermost one of the plurality of gate electrodes and lower than an upper surface thereof.

15. The vertical memory device as claimed in claim 14, wherein a lower surface of the doped semiconductor pattern is lower than the upper surface of the substrate relative to a bottom surface of the substrate.

16. The vertical memory device as claimed in claim 14, wherein the lower semiconductor pattern further includes a diffusion barrier between the doped semiconductor pattern and each of the first and second undoped semiconductor patterns.

17. The vertical memory device as claimed in claim 14, wherein the lower semiconductor pattern further comprises a diffusion barrier between the doped semiconductor pattern and the second undoped semiconductor pattern, the doped semiconductor pattern including a silicon pattern doped with p-type impurities, and the diffusion barrier including a silicon pattern doped with carbon and the p-type impurities.

* * * * *